US009806695B2

(12) United States Patent
Kim

(10) Patent No.: US 9,806,695 B2
(45) Date of Patent: Oct. 31, 2017

(54) INTEGRATED CIRCUIT DEVICES HAVING CLOCK GATING CIRCUITS THEREIN

(71) Applicant: Samsung Electronics Co., Ltd., Suwon-si, Gyeonggi-do (KR)

(72) Inventor: Byung-jo Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/212,406

(22) Filed: Jul. 18, 2016

(65) Prior Publication Data

US 2017/0085254 A1 Mar. 23, 2017

(30) Foreign Application Priority Data

Sep. 18, 2015 (KR) .................... 10-2015-0132600

(51) Int. Cl.
*G06F 1/04* (2006.01)
*H03K 3/012* (2006.01)
*H03K 5/15* (2006.01)

(52) U.S. Cl.
CPC ......... *H03K 3/012* (2013.01); *H03K 5/15093* (2013.01)

(58) Field of Classification Search
CPC .................... H03K 3/012; H03K 5/15093
See application file for complete search history.

(56) References Cited

U.S. PATENT DOCUMENTS

| 6,232,820 | B1 * | 5/2001 | Long ........................ G06F 1/10 327/374 |
|---|---|---|---|
| 7,346,723 | B2 | 3/2008 | Kim et al. |
| 7,392,406 | B2 | 6/2008 | Yoon et al. |
| 7,535,790 | B2 | 5/2009 | Harada |
| 7,802,118 | B1 * | 9/2010 | Abdalla .................... G06F 1/08 713/300 |
| 8,671,380 | B2 * | 3/2014 | Wang ........................ G06F 1/08 327/172 |
| 9,047,014 | B2 | 6/2015 | Magklis et al. |
| 2010/0253409 | A1 * | 10/2010 | Yeh ........................... G06F 1/10 327/295 |
| 2011/0271134 | A1 | 11/2011 | Hofmann |
| 2013/0031284 | A1 | 1/2013 | Yun et al. |
| 2013/0124907 | A1 | 5/2013 | Aoki |
| 2013/0159757 | A1 | 6/2013 | Park et al. |

FOREIGN PATENT DOCUMENTS

| JP | 2000-357124 A | 12/2000 |
| JP | 2005-267255 A | 9/2005 |
| JP | 2007-052525 A | 3/2007 |
| KR | 1020070089428 A | 8/2007 |

\* cited by examiner

*Primary Examiner* — Kenneth B Wells
(74) *Attorney, Agent, or Firm* — Myers Bigel, P.A.

(57) ABSTRACT

An integrated circuit device includes a clock gating circuit, which is configured to generate a first plurality of clocks in response to a first reference clock at a first frequency and a plurality of operation enable signals. A plurality of functional circuits are provided, which are responsive to respective ones of the first plurality of clocks. The plurality of functional circuits is configured to generate respective ones of the plurality of operation enable signals, with each of the plurality of operation enable signals having a first logic state that enables a respective clock within said clock gating circuit and a second logic state that disables the respective clock within said clock gating circuit.

16 Claims, 20 Drawing Sheets

INTEGRATED CIRCUIT DEVICES HAVING CLOCK GATING CIRCUITS THEREIN

REFERENCE TO PRIORITY APPLICATION

This application claims the benefit of Korean Patent Application No. 10-2015-0132600, filed Sep. 18, 2015, in the Korean Intellectual Property Office, the disclosure of which is incorporated herein in its entirety by reference.

BACKGROUND

The inventive concept relates to a semiconductor device, and more particularly, to a semiconductor device that performs clock gating.

Recently, high integration, speed up, and low power consumption of electronic products are being made. Particularly, in electronic devices which operate using battery like mobile devices, minimizing consumption power is becoming an important issue. Clock gating is being researched for reducing consumption of power in electronic devices. Clock gating is technology that controls a clock used by semiconductor devices included in electronic devices or circuits integrated into the semiconductor devices. When some of the semiconductor devices or integrated circuits thereof are not used, a clock supplied to an unused part is blocked. Consumption power of a semiconductor device is reduced by selectively blocking a clock.

SUMMARY

The inventive concept provides a semiconductor device that effectively performs clock gating, thereby reducing consumption power. According to one embodiment of the inventive concept, there is provided a semiconductor device including: a plurality of function blocks configured to perform different functions; a clock generator configured to generate a reference clock; and a clock gating unit configured to generate a plurality of clocks respectively corresponding to the plurality of function blocks, based on the reference clock, respectively supply the plurality of clocks to the plurality of function blocks, and perform gating on the plurality of clocks, based on a state of a corresponding function block.

According to another embodiment of the inventive concept, there is provided a semiconductor device including: a first function block including at least one first register that operates based on a first clock; a second function block including at least one second register that operates based on a second clock; an interface unit configured to receive data and an address from an external device and transmit the data to a register corresponding to the address; and a clock gating unit configured to perform gating on a reference clock to generate the first clock and the second clock, supply the first clock to a first function block through a first lane, and supply the second clock to a second function block through a second lane.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
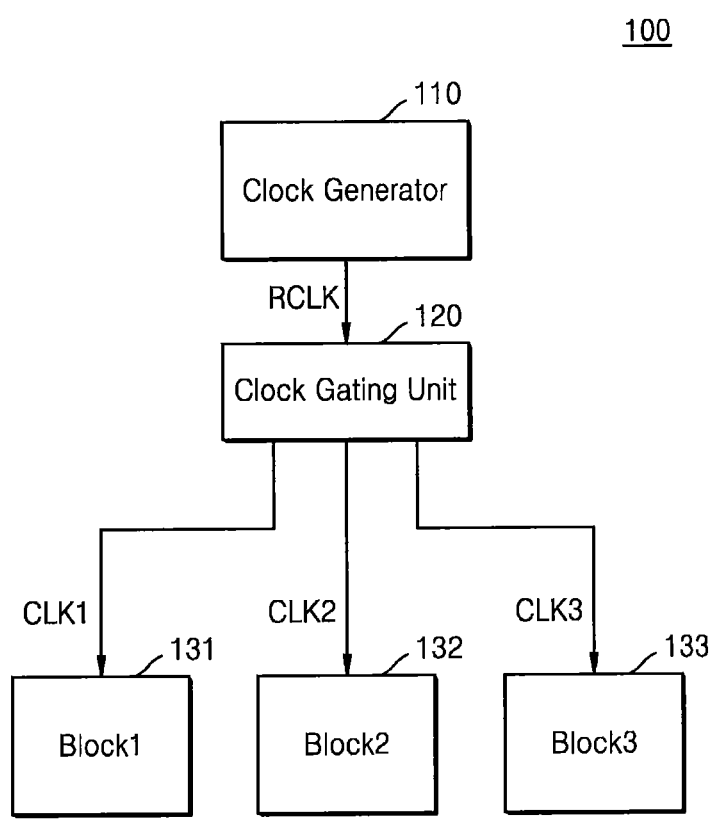
FIG. 1 is a block diagram schematically illustrating a semiconductor device according to an exemplary embodiment.

As used herein, the term "and/or" includes any and all combinations of one or more of the associated listed items. Expressions such as "at least one of" when preceding a list of elements, modify the entire list of elements and do not modify the individual elements of the list.

Hereinafter, example embodiments of the inventive concept will be described in detail with reference to the accompanying drawings. Embodiments of the inventive concept are provided so that this disclosure will be thorough and complete, and will fully convey the scope of the inventive concept to one of ordinary skill in the art. Since the inventive concept may have diverse modified embodiments, preferred embodiments are illustrated in the drawings and are described in the detailed description of the inventive concept. However, this does not limit the inventive concept within specific embodiments and it should be understood that the inventive concept covers all the modifications, equivalents, and replacements within the idea and technical scope of the inventive concept. Like reference numerals refer to like elements throughout.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In various exemplary embodiments of the disclosure, the meaning of 'comprise', 'include', or 'have' specifies a property, a region, a fixed number, a step, a process, an element and/or a component but does not exclude other properties, regions, fixed numbers, steps, processes, elements and/or components.

It will be understood that, although the terms first, second, etc. used herein may qualify various elements according to various exemplary embodiments, these elements should not be limited by these terms. For example, the terms do not limit the order and/or importance of corresponding elements. These terms are only used to distinguish one element from another. For example, a first user equipment and a second user equipment are user equipment and denote different user equipment. For example, a first element may be referred to as a second element without departing from the spirit and scope of the inventive concept, and similarly, the second element may also be referred to as the first element.

In the case in which a component is referred to as being "connected" or "accessed" to other component, it should be understood that not only the component is directly connected or accessed to the other component, but also there may exist another component between the components. Meanwhile, in the case in which a component is referred to as being "directly connected" or "directly accessed" to other component, it should be understood that there is no component therebetween.

In the following description, the technical terms are used only for explain a specific exemplary embodiment while not limiting the inventive concept. The terms of a singular form may include plural forms unless referred to the contrary.

Unless otherwise defined, all terms (including technical and scientific terms) used herein have the same meaning as commonly understood by one of ordinary skill in the art to which example embodiments belong.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram schematically illustrating a semiconductor device 100 according to an exemplary embodiment. Referring to FIG. 1, the semiconductor device 100 may include a clock generator 110, a clock gating unit 120, and a plurality of function blocks 131 to 133. The plurality of function blocks 131 to 133 may be integrated circuits (ICs) for performing different functions in the semiconductor device 100. For example, when the semiconductor device 100 is a memory device, the plurality of function blocks 131 to 133 may include at least one of a control logic, a row decoder, a column decoder, a voltage generator, and/or the like. As another example, when the semiconductor device 100 is an image sensor, the plurality of function blocks 131 to 133 may include a timing generator, an image signal processor, an analog-digital (A/D) converter, and/or the like. The plurality of function blocks 131 to 133 may each be implemented with a digital circuit or an analog circuit. Each of the function blocks 131 to 133 may operate based on (e.g., in-sync with) a clock applied thereto. A first function block 131 may operate based on a first clock CLK1, a second function block 132 may operate based on a second clock CLK2, and a third function block 133 may operate based on a third clock CLK3.

In FIG. 1, the semiconductor device 100 is illustrated as including three function blocks 131 to 133, but the present embodiment is, not limited thereto. In other exemplary embodiments, the number of function blocks included in the semiconductor device 100 may be diversified. Also, in FIG. 1, it is illustrated that one clock is applied to each of the function blocks 131 to 133, but the present embodiment is not limited thereto. In other exemplary embodiments, a plurality of clocks may be applied to each of the function blocks 131 to 133.

The clock generator 110 may generate a reference clock RCLK. In an exemplary embodiment, the clock generator 110 may generate the reference clock RCLK, based on an external clock received from an external device. For example, the clock generator 110 may generate the reference clock RCLK synchronized with the external clock. Alternatively, the clock generator 110 may divide the external clock to generate the reference clock RCLK. For example, the clock generator 110 may include a circuit such as a delay locked loop (DLL) or a phase locked loop (PLL). In another exemplary embodiment, when an enable signal is applied to the clock generator 110, the clock generator 110 may generate a clock. For example, the clock generator 110 may include an oscillator circuit. However, the present embodiment is not limited thereto. In other exemplary embodiments, the clock generator 110 may be implemented with various kinds of circuits that each generate the reference clock RCLK having a certain frequency. Moreover, the clock generator 110 may generate a plurality of reference clocks RCLK. The plurality of reference clocks RCLK may have different frequencies or different phases.

The clock gating unit 120 may receive the reference clock RCLK from the clock generator 110 and may generate a plurality of clocks CLK1 to CLK3 respectively corresponding to the plurality of function blocks 131 to 133, based on the reference clock RLCK. Frequencies or phases of the clocks CLK1 to CLK3 may be the same or may differ. Alternatively, frequencies or phases of some of the clocks CLK1 to CLK3 may be the same.

The clock gating unit 120 may directly receive the reference clock RCLK from the clock generator 110. Also, the clock gating unit 120 may independently supply each of the clocks CLK1 to CLK3 to a corresponding function block. For example, the clock gating unit 120 may supply a first clock CLK1 to the first function block 131, supply a second clock CLK2 to the second function block 132, and supply a third clock CLK3 to the third function block 133, through different transmission paths having different transmission characteristics.

The clock gating unit 120 may perform gating on each of the clocks CLK1 to CLK3, based on a state of a corresponding function block. For example, the clock gating unit 120 may generate the first clock CLK1 supplied to the first function block 131, based on the reference clock RCLK and in this case, the clock gating unit 120 may perform gating on the first clock CLK1, based on a state of the first function block 131. For example, when the first function block 131 is in an operating state, the clock gating unit 120 may output the first clock CLK1 to the first function block 131. When the first function block 131 is not in the operating state, for example, when the first function block 131 is in a standby state or an idle state or does not transmit or receive data to or from another function block (or another circuit), the clock gating unit 120 may block the first clock CLK1. As described above, the clock gating unit 120 may separately perform gating on the plurality of clocks CLK1 to CLK3, based on a state of a corresponding function block.

In the semiconductor device 100 according to an exemplary embodiment, the clocks CLK1 to CLK3 may be separately supplied to the plurality of function blocks 131 to 133, and gating may be performed for the clocks CLK1 to CLK3 respectively corresponding to the function blocks 131 to 133, based on a state of a corresponding function block. Therefore, a corresponding clock may be separately transmitted to a function block having an operating state among the plurality of function blocks 131 to 133, and a clock corresponding to a function block which is not in the operating state may not be transmitted to a function block. In the semiconductor device 100, the number of clock transmissions is minimized, thereby reducing consumption power caused by toggling of a clock.

Figure 2:
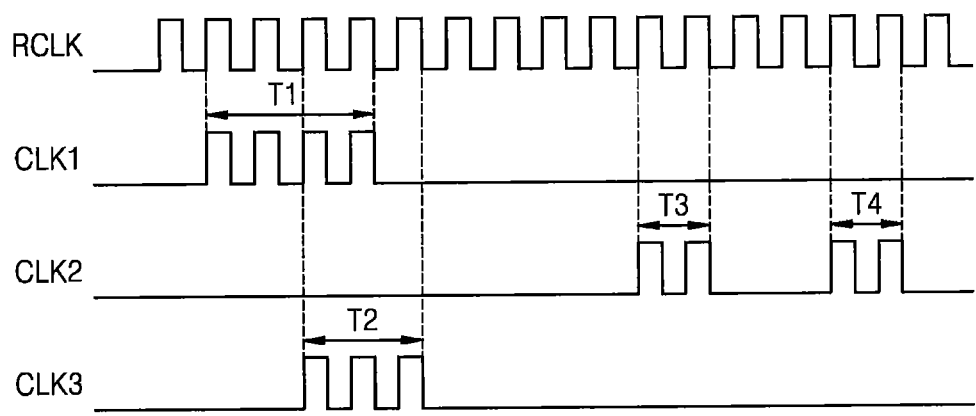
FIG. 2 is a timing diagram of the semiconductor device of FIG. 1.

FIG. 2 is a timing diagram of the semiconductor device of FIG. 1. FIG. 2 shows waveforms of clocks. Referring to FIG. 2, the first to third clocks CLK1 to CLK3 may be generated by performing clock gating on the reference clock RCLK. The first clock CLK1 may be output in a first period T1 where the first function block 131 (see FIG. 1) is in an operating state, and may be blocked in the other periods. The second clock CLK2 may be output in a second period T2 where the second function block 132 (see FIG. 1) is in the operating state, and may be blocked in the other periods. The third clock CLK3 may be output in a third period T3 and a fourth period T4 where the third function block 133 (see FIG. 1) is in the operating state, and may be blocked in the other periods. In an exemplary embodiment, periods where the first to third clocks CLK1 to CLK3 are respectively output may overlap each other. Thus, in the semiconductor device 100 (see FIG. 1) according to an exemplary embodiment, a clock may be separately transmitted to a function block having the operating state among the plurality of function blocks 131 to 133, and may not be transmitted to a function block which is not in the operating state.

Figure 3:
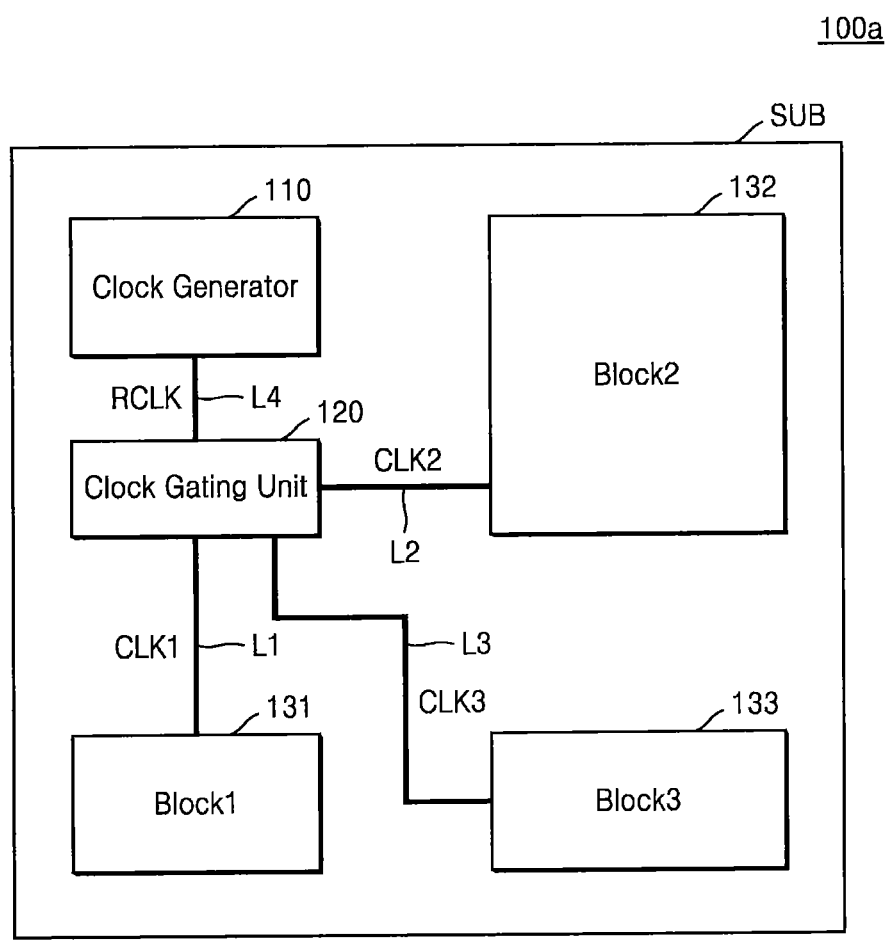
FIG. 3 is a block diagram illustrating an implementation example of a semiconductor device according to an exemplary embodiment.

FIG. 3 is a block diagram illustrating an implementation example of a semiconductor device according to an exemplary embodiment. FIG. 3 illustrates an example where elements of the semiconductor device 100 of FIG. 1 are implemented on a substrate SUB. Referring to FIG. 3, a semiconductor device 100a may include a plurality of semiconductor ICs integrated onto the substrate SUB. As illustrated, a plurality of function blocks 131 to 133, a clock generator 110, and a clock gating unit 120 may be integrated onto the substrate SUB. Also, a signal transmission path between semiconductor ICs may be provided on the substrate SUB. For example, first to fourth lines L1 to L4 may be disposed as signal transmission paths on the substrate SUB. Although not shown, a plurality of buffer circuits for smoothing transmission of a signal may be respectively disposed on a plurality of the lines L1 to L4. For example, each of the buffer circuits may be an inverter.

The clock gating unit 120 may be disposed adjacent to the clock generator 110 and may receive a reference clock RCLK from the clock generator 110 through the fourth line L4. The clock gating unit 120 may generate the first to third clocks CLK1 to CLK3, based on the reference clock RCLK and may perform gating on a corresponding clock, based on a state of each of the function blocks 131 to 133.

The clock gating unit 120 may transmit a corresponding clock to each of the first to third function blocks 131-133 through a point-to-point connection. The clock gating unit 120 may transmit the first clock CLK1 to the first function block 131 through the first line L1, transmit the second clock CLK2 to the second function block 132 through the second line L2, and transmit the third clock CLK3 to the third function block 133 through the third line L3. Lengths of the first to third clocks CLK1 to CLK3 may differ. In an exemplary embodiment, a length of the fourth line L4 may be shorter than a shortest length among the lengths of the first to third clocks CLK1 to CLK3. In another exemplary embodiment, the length of the fourth line L4 may be shorter than at least one of the lengths of the first to third clocks CLKI to CLK3.

As described above, according to an exemplary embodiment, the clock gating unit 120 disposed adjacent to the clock generator 110 may transmit the clocks CLK1 to CLK3, respectively corresponding to the plurality of function blocks 131 to 133, through different signal transmission paths and may perform gating on each of the clocks CLK1 to CLK3 respectively corresponding to the plurality of function blocks 131 to 133, based on a state of each of the function blocks 131 to 133. Therefore, a clock corresponding to an unoperated function block may be previously blocked by the clock gating unit 120 adjacent to the clock generator 110 and thus may not be transmitted through a signal transmission path.

As described above, the plurality of signal transmission paths may include a plurality of buffer circuits, respectively. When a clock is transmitted through a signal transmission path, dynamic consumption power caused by toggling of a clock may occur in the plurality of buffer circuits. A clock supplied to a function block may be received by the function block, and then, when gating is performed for the received clock, despite the clock being blocked, dynamic consumption power caused by toggling of the clock may occur in a signal transmission path of the clock and a clock reception circuit included in the function block. However, in the semiconductor device 100a according to an exemplary embodiment, the clock gating unit 120 disposed adjacent to the clock generator 110 may respectively transmit the plurality of clocks CLK1 to CLK3 to the plurality of function blocks 131 to 133 through separate signal transmission paths, and at this time, the clock gating unit 120 may not output a clock to a signal transmission path corresponding to a function block which is not in an operating state, thereby reducing consumption power caused by clock gating.

Figure 4:
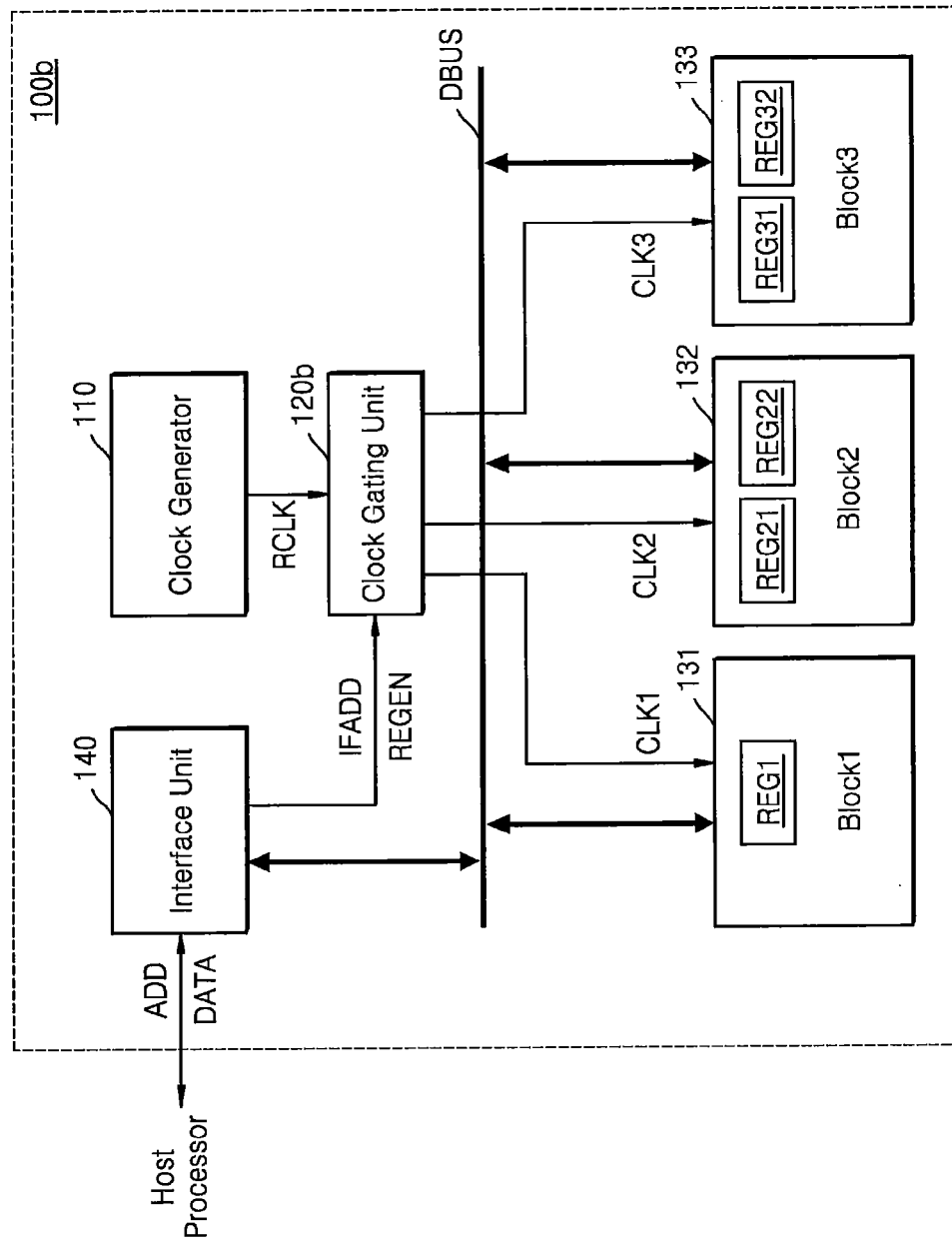
FIG. 4 is a block diagram illustrating an implementation example of a semiconductor device according to an exemplary embodiment.

FIG. 4 is a block diagram illustrating an implementation example of a semiconductor device according to an exemplary embodiment. A semiconductor device 100b may receive, through a serial interface, data DATA from an external device (for example, a host processor, a memory, or a user interface (UI) of an electronic device equipped with the semiconductor device 100b) or may transmit the data DATA to the outside. Also, the data DATA may be transferred through a bus interface in the semiconductor device 100b. Referring to FIG. 4, the semiconductor device 100b may include a plurality of function blocks 131 to 133, a clock generator 110, a clock gating unit 120b, and an interface unit 140. The descriptions of the clock generator 110, the clock gating unit 120, and the function blocks 131 to 133 illustrated in FIGS. 1 and 3 may be applied to the present embodiment.

Each of the function blocks 131 to 133 may include at least one register. For example, a plurality of registers REG1, REG21, REG22, REG31 and REG32 may each be implemented with a latch, a flip-flop or the like. Each of the registers REG1, REG21, REG22, REG31 and REG32 may store received data, based on a clock supplied to a corresponding function block. For example, the register REG1 of a first function block 131 may store data in response to a first clock CLK1, the registers REG21 and REG22 of a second function block 132 may store data in response to a second clock CLK2, and the registers REG31 and REG32 of a third function block 133 may store data in response to a third clock CLK3. In this case, data stored in each of the registers may be data associated with an operation mode of a function block including a corresponding register or various options for setting an operation environment of the function block, or may be received from an external device.

The interface unit 140 may receive or transmit data DATA from or to the outside. The interface unit 140 may communicate with the outside through a serial interface. The serial interface may be, for example, one of a mobile display digital interface (MDDI), an inter integrated circuit (I2C) interface, a serial peripheral interface (SPI), a camera control interface (CCI), a camera serial interface (CSI), a micro controller unit (MCU) interface, a mobile industry processor interface (MIPI), an embedded display port (eDP) interface, and a high definition multimedia interface (HDMI). However, the present embodiment is not limited thereto, and the interface unit 140 may communicate with the outside through various serial interfaces. In FIG. 4, the semiconductor device 100b is illustrated as including one interface unit 140, but is not limited thereto. In other exemplary embodiments, the semiconductor device 100b may include two interface units, and in this case, one of the two interface units may receive data from the outside, and the other may transmit the data to the outside.

In an exemplary embodiment, the interface unit 140 may receive the data DATA or an address signal ADD. The address signal ADD may indicate a circuit (for example, a register) to which the data DATA is transmitted in the semiconductor device 100b. Hereinafter, the circuit to which the data DATA is transmitted is assumed as a register included in the semiconductor device 100b, and the following description will be made.

The interface unit 140 may decode the received address signal ADD to determine a register (for example, one of the registers REG1, REG21, REG22, REG31 and REG32) to which the data DATA is to be transmitted, and may transmit the data DATA to the determined register. The interface unit 140 may transmit the data DATA through a data bus DBUS. Therefore, the data bus DBUS may be occupied in a period where the interface unit 140 transmits the data DATA to a register. The interface unit 140 may supply address information IFADD, including an address of a register or an address of a function block including the register, to the clock gating unit 120b. In an exemplary embodiment, the interface unit 140 may supply the address information IFADD and a register enable signal REGEN to the clock gating unit 120b. The register enable signal REGEN may indicate a state where data is capable of being transmitted to a register. In a period (for example, when the register enable signal REGEN has a logic high level) where the register enable signal REGEN is activated, the interface unit 140 may transmit the data DATA to a register through the data bus DBUS, and the register may receive and store the data DATA.

The clock generator 110 may generate the reference clock RCLK, and the clock gating unit 120b may generate the plurality of clocks CLK1 to CLK3 respectively corresponding to the plurality of function blocks 131 to 133, based on the reference clock RCLK. The clock gating unit 120b may perform gating on the plurality of clocks CLK1 to CLK3, based on the address information IFADD and the register enable signal REGEN supplied from the interface unit 140. Therefore, in a period where the register enable signal REGEN is activated, the clock gating unit 120 may supply a clock to a function block corresponding to the address information IFADD. For example, when the address information IFADD indicates the register REG1 or the first function block 131, the clock gating unit 120b may block an output of each of the second clock CLK2 and the third clock CLK3, and in the period where the register enable signal REGEN is activated, the clock gating unit 120b may output the first clock CLK1 to the first function block 131.

The register REG1 of the first function block 131 may store the data DATA received from the interface unit 140, based on the first clock CLK1. At this time, the data DATA and a clock may not be received by the second function block 132 and the third function block 133, the registers REG21, REG22, REG31 and REG32 may not operate.

Figure 5:
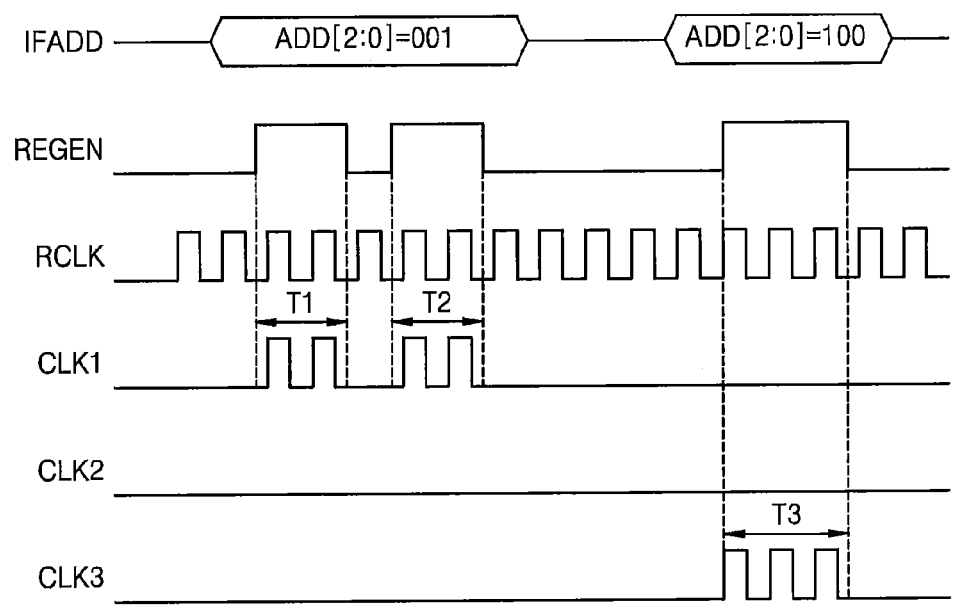
FIG. 5 is a timing diagram of the semiconductor device of FIG. 4.

FIG. 5 is a timing diagram of the semiconductor device of FIG. 4. FIG. 5 shows the reference clock RCLK, the address information IFADD, and the register enable signal REGEN applied to the clock gating unit 120b and the clocks CLK1 to CLK3 output from the clock gating unit 120b. The clock gating unit 120b may generate the plurality of clocks CLK1 to CLK3, based on the reference clock RCLK and may perform gating on the plurality of clocks CLK1 to CLK3, based on the address information IFADD and the register enable signal REGEN.

Referring to FIG. 5, when the register enable signal REGEN is activated (for example, a logic high level), a clock corresponding to a function block indicated by the address information IFADD among the plurality of clocks CLK1 to CLK3 may be output, and outputs of the other clocks may be blocked. In an exemplary embodiment, the address information IFADD may include a plurality of bits. For example, the address information IFADD may include 3-bit data ADD[2:0]. If the 3-bit data ADD[2:0] is 001, the 3-bit data ADD[2:0] may indicate the first function block 131 (see FIG. 4). If the 3-bit data ADD[2:0] is 010, the 3-bit data ADD[2:0] may indicate the second function block 132 (see FIG. 4). If the 3-bit data ADD[2:0] is 100, the 3-bit data ADD[2:0] may indicate the third function block 133 (see FIG. 4).

For example, as shown in FIG. 5, the address information IFADD may indicate the first function block 131, and the first clock CLK1 may be output in first and second periods T1 and T2 where the register enable signal REGEN is activated. The first clock CLK1 may be supplied to the first function block 131. At this time, the second clock CLK2 and the third clock CLK3 may be blocked from being output to the second function block 132 and the third function block 133. Subsequently, the address information IFADD may indicate the third function block 133, and the third clock CLK3 may be output in a third period T3 where the register enable signal REGEN is activated. The third clock CLK3 may be supplied to the third function block 133. At this time, the first clock CLK1 and the second clock CLK2 may be blocked from being output to the first function block 131 and the second function block 132.

Figure 6A:
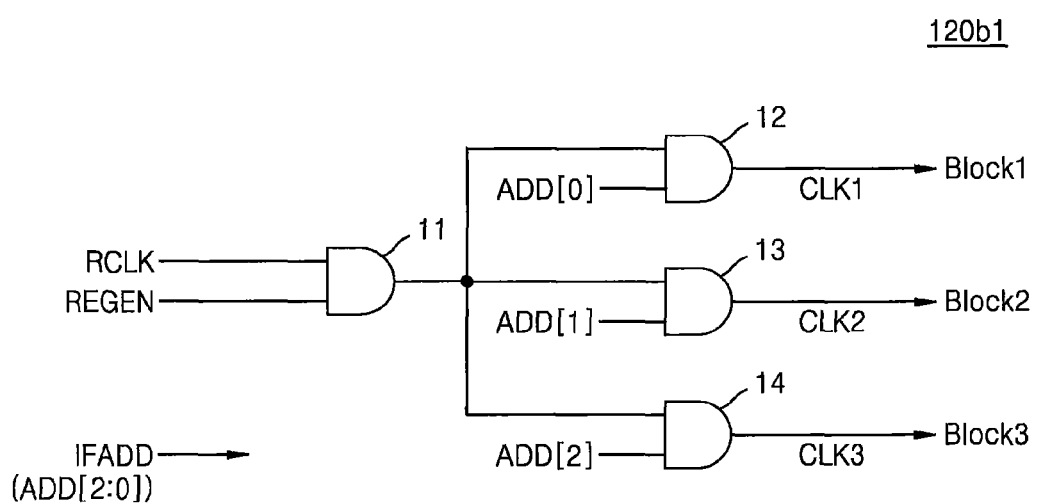
FIGS. 6A to 6C illustrate implementation examples of a clock gating unit of FIG. 4.
Figure 6B:
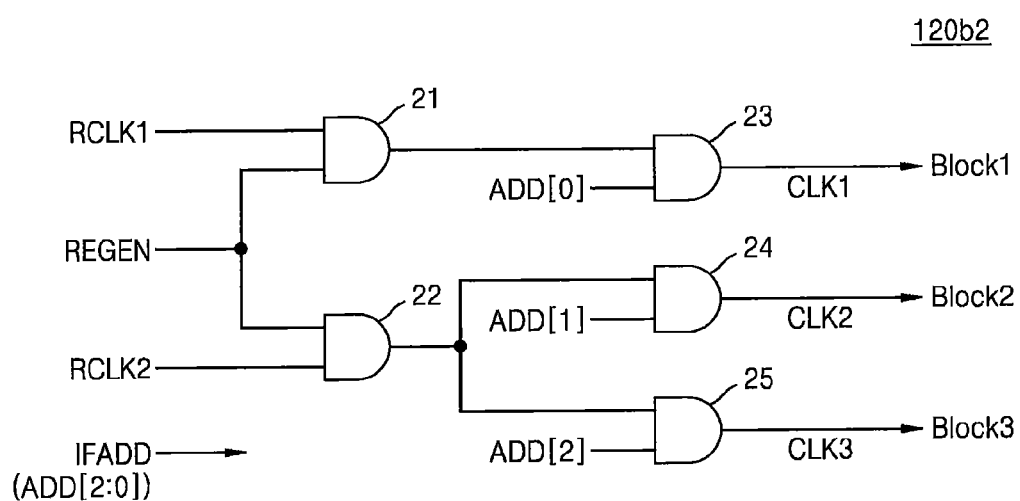
Figure 6C:
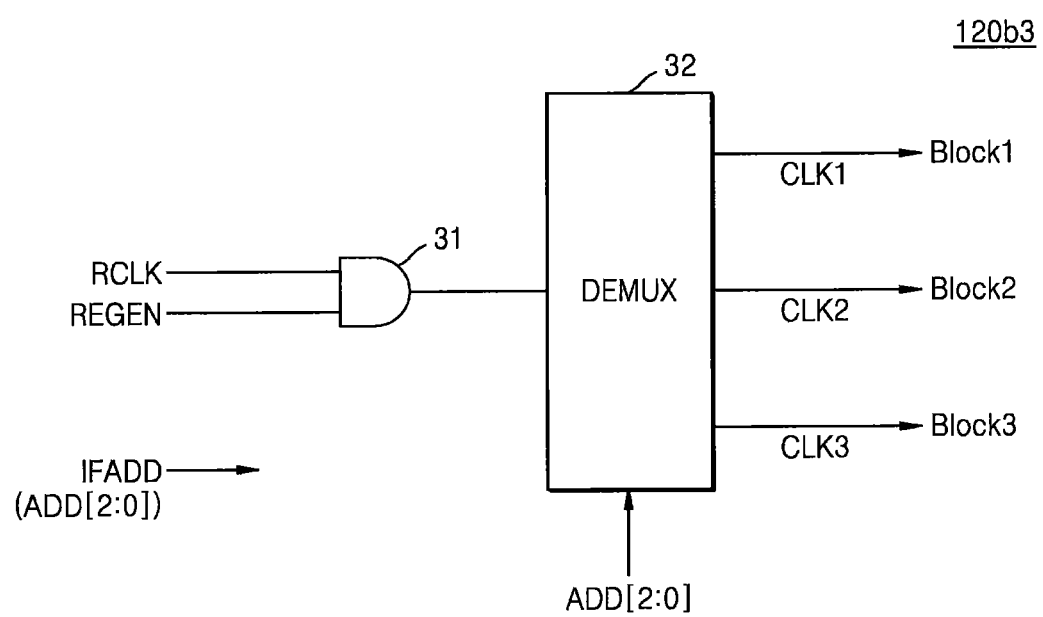

FIGS. 6A to 6C illustrate implementation examples of the clock gating unit of FIG. 4. Referring to FIG. 6A, a clock gating unit 120b1 may be implemented with a plurality of logic gates 11 to 14. In an exemplary embodiment, each of the logic gates 11 to 14 may be an AND gate. The clock gating unit 120b1 may perform a logic combination on a reference clock RCLK, address information IFADD, and a register enable signal REGEN received by the clock gating unit 120b1 by using the logic gates 11 to 14 to generate a plurality of clocks CLK1 to CLK3 and may perform gating on the clocks CLK1 to CLK3.

A first AND gate 11 may perform gating on the reference clock RCLK, based on the register enable signal REGEN and may output the gated reference clock RCLK. Each of second to fourth AND gates 12 to 14 may perform gating on a clock (for example, the gated reference clock RCLK) output from the first AND gate 11, based on at least one of bits ADD[2:0] of the address information IFADD. When a first bit ADD[0] of the address information IFADD is logic high, the second AND gate 12 may output the first clock CLK1, and when the first bit ADD[0] is logic low, the second AND gate 12 may block the first clock CLK1. When a second bit ADD[1] of the address information IFADD is logic high, the third AND gate 13 may output the second clock CLK2, and when the second bit ADD[1] is logic low, the third AND gate 13 may block the second clock CLK2. When a third bit ADD[2] of the address information IFADD is logic high, the fourth AND gate 14 may output the third clock CLK3, and when the third bit ADD[2] is logic low, the fourth AND gate 14 may block the third clock CLK3.

Referring to FIG. 6B, a clock gating unit 120b2 may be implemented with a plurality of logic gates 21 to 25. In an exemplary embodiment, each of the logic gates 21 to 25 may be an AND gate. The clock gating unit 120b2 may perform a logic combination on reference clocks RCLK1 and RCLK2, address information IFADD, and a register enable signal REGEN received by the clock gating unit 120b2 by using the logic gates 21 to 25 to generate a plurality of clocks CLK1 to CLK3 and may perform gating on the clocks CLK1 to CLK3.

A configuration and an operation of FIG. 6B are similar to those of FIG. 6A. In FIG. 6B, the clock gating unit 120b2 may generate the plurality of clocks CLK1 to CLK3, based on a plurality of reference clocks (for example, a first reference clock RCLK1 and a second reference clock RCLK2). In an exemplary embodiment, frequencies or phases of the first and second reference clocks RCLK1 and RCLK2 may differ. For example, as shown, a first clock CLK1 may be generated based on the first reference clock RCLK1, and a second clock CLK2 and a third clock CLK3 may be generated based on the second reference clock RCLK2.

A first AND gate 21 may perform gating on the first reference clock RCLK1, based on the register enable signal REGEN. A second AND gate 22 may perform gating on the second reference clock RCLK2, based on the register enable signal REGEN. A third AND gate 23 may perform gating on a clock (for example, the gated first reference clock RCLK1), output from the first AND gate 21, based on a first bit ADD[0] of the address information IFADD to generate the first clock CLK1. When the first bit ADD[0] of the address information IFADD is logic high, the third AND gate 23 may output the first clock CLK1, and when the first bit ADD[0] is logic low, the third AND gate 23 may block the first clock CLK1.

A fourth AND gate 24 may perform gating on a clock (for example, the gated second reference clock RCLK2), output from the second AND gate 22, based on a second bit ADD[1] of the address information IFADD to generate the second clock CLK2. A fifth AND gate 25 may perform gating on a clock (for example, the gated second reference clock RCLK2), output from the second AND gate 22, based on a third bit ADD[2] of the address information IFADD to generate the third clock CLK3. When the second bit ADD[1] of the address information IFADD is logic high, the fourth AND gate 24 may output the second clock CLK2, and when the second bit ADD[1] is logic low, the fourth AND gate 24 may block the second clock CLK2. When the third bit ADD[2] of the address information IFADD is logic high, the fifth AND gate 25 may output the third clock CLK3, and when the third ADD[2] is logic low, the fifth AND gate 25 may block the third clock CLK3.

Referring to FIG. 6C, a clock gating unit 120b3 may include a logic gate 31 and a demultiplexer 32. The logic gate 31 may perform gating on a reference clock RCLK, based on a register enable signal REGEN. In an exemplary embodiment, the logic gate 31 may be an AND gate. The demultiplexer 32 may output a clock (for example, the gated reference clock RCLK), output from the logic gate 31, as one of first to third clocks CLK1 to CLK3, based on three-bit data ADD[2:0] of address information IFADD. When the address information IFADD indicates the first function block 131 (see FIG. 4), the demultiplexer 32 may output the gated reference clock RCLK as the first clock CLK1. When the address information IFADD indicates the second function block 132 (see FIG. 4), the demultiplexer 32 may output the gated reference clock RCLK as the second clock CLK2. When the address information IFADD indicates the second function block 133 (see FIG. 4), the demultiplexer 32 may output the gated reference clock RCLK as the third clock CLK3.

Hereinabove, an implementation example of the clock gating unit 120b of FIG. 4 has been described with reference to FIGS. 6A to 6C. However, this is merely an example, and the inventive concept is not limited thereto. A configuration of the clock gating unit 120b of FIG. 4 may be variously modified.

Figure 7:
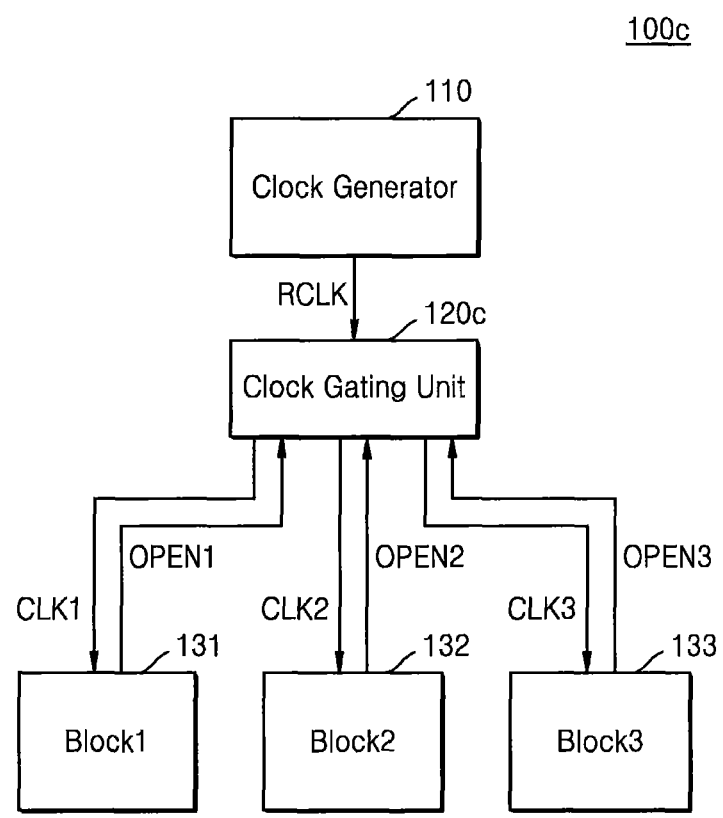
FIG. 7 is a block diagram illustrating an implementation example of a semiconductor device according to an exemplary embodiment.

FIG. 7 is a block diagram illustrating an implementation example of a semiconductor device according to an exemplary embodiment. Referring to FIG. 7, a semiconductor device 100c may include a plurality of function blocks 131 to 133, a clock generator 110, and a clock gating unit 120c. The descriptions of the clock generator 110, the clock gating unit 120, and the function blocks 131 to 133 illustrated in FIGS. 1 and 3 may be applied to the present embodiment. Thus, repetitive descriptions are not repeated.

In the present embodiment, the plurality of function blocks 131 to 133 may supply operation enable signals OPEN1 to OPEN3 indicating an operating state to the clock gating unit 120c. For example, when a first function block 131 is in the operating state, the first function block 131 may supply a first operation enable signal OPEN1 having a logic high level to the clock gating unit 120c. When the first function block 131 is not in the operating state, for example, when the first function block 131 is in the standby state or the idle state or does not transmit or receive arbitrary data to or from another function block (or another circuit), the first function block 131 may supply the first operation enable signal OPEN1 having a logic low level to the clock gating unit 120c. Similarly, the second function block 132 and the third function block 133 may respectively supply the second operation enable signal OPEN2 and the third operation enable signal OPEN3 to the clock gating unit 120c.

The clock gating unit 120c may perform gating on a plurality of clocks CLK1 to CL.K3, based on the operation enable signals OPEN1 to OPEN3. For example, the clock gating unit 120c may perform gating on a first clock CLK1, based on the first operation enable signal OPEN1 supplied from the first function block 131. When the first operation enable signal OPEN1 has a logic high level, the clock gating unit 120c may output the first clock CLK1, and when the first operation enable signal OPEN1 has a logic low level, the clock gating unit 120c may block the first clock CLK1. Similarly, the clock gating unit 120c may perform gating on a second clock CLK2, based on the second operation enable signal OPEN2 supplied from the second function block 132 and may perform gating on a third clock CLK3, based on the third operation enable signal OPEN3 supplied from the third function block 133.

According to the present embodiment, the clock gating unit 120c may determine states of the function blocks 131 to 133, based on the operation enable signals OPEN1 to OPEN3 respectively received from the function blocks 131 to 133. Only when each of the function blocks 131 to 133 is in an operating state, the clock gating unit 120c may supply a corresponding clock.

Figure 8:
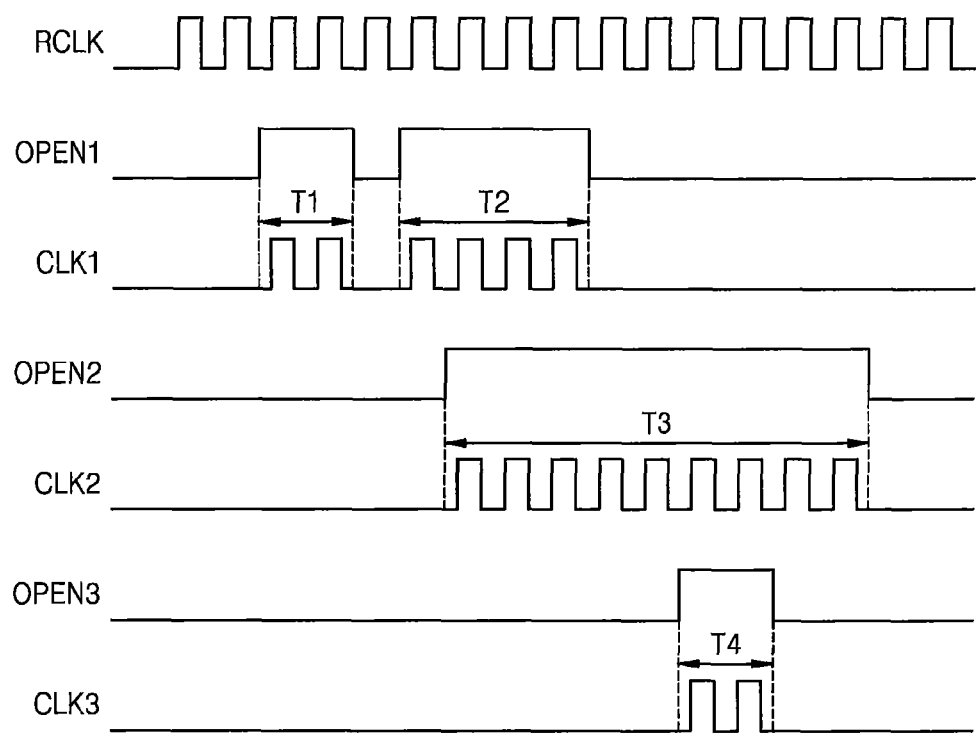
FIG. 8 is a timing diagram of the semiconductor device of FIG. 7.

FIG. 8 is a timing diagram of the semiconductor device of FIG. 7. FIG. 8 shows the reference clock RCLK and the operation enable signals OPEN1 to OPEN3 applied to the clock gating unit 120c and the clocks CLK1 to CLK3 output from the clock gating unit 120c. The clock gating unit 120c may generate the plurality of clocks CLK1 to CLK3, based on the reference clock RCLK and may perform gating on the clocks CLK1 to CLK3, based on the operation enable signals OPEN1 to OPEN3. Referring to FIG. 8, gating on each of the first to third clocks CLK1 to CLK3 may be performed based on a corresponding operation enable signal. In first and second periods T1 and T2 where the first operation enable signal OPEN1 has a logic high level, the first clock CLK1 may be output, and in another period where the first operation enable signal OPEN1 has a logic low level, the first clock CLK1 may be blocked. In a third period T3 where the second operation enable signal OPEN2 has a logic high level, the second clock CLK2 may be output, and in another period where the second operation enable signal OPEN2 has a logic low level, the second clock CLK2 may be blocked. In a fourth period T4 where the third operation enable signal OPEN3 has a logic high level, the third clock CLK3 may be output, and in another period where the third operation enable signal OPEN3 has a logic low level, the third clock CLK3 may be blocked. At this time, the second period T2 and the third period T3 may overlap each other, and the third period T3 and the fourth period T4 may overlap each other. As described above, periods where the first to third clocks CLK1 to CLK3 are respectively output may overlap each other.

Figure 9A:
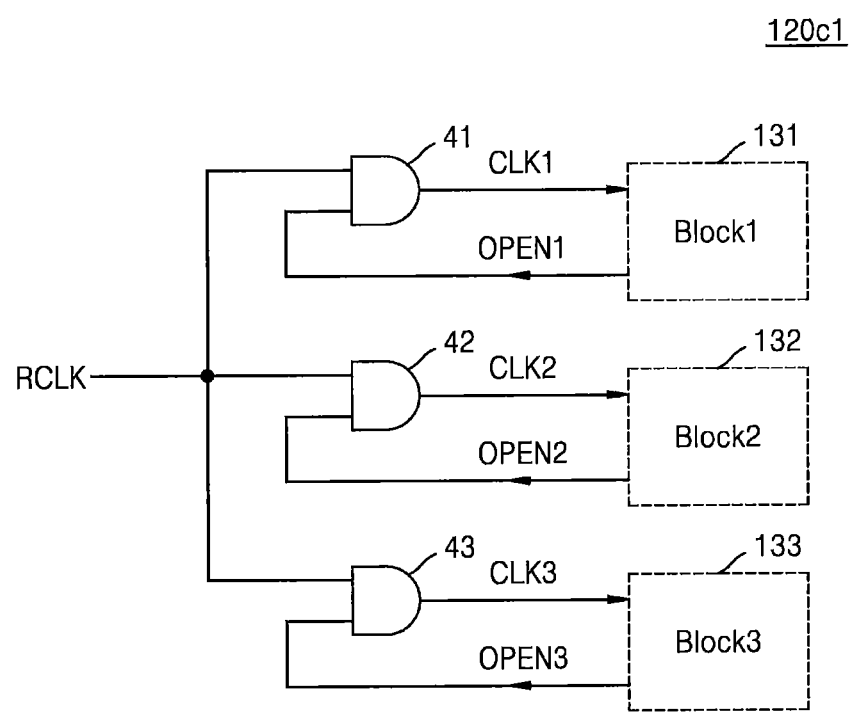
FIGS. 9A and 9B illustrate implementation examples of a clock gating unit of FIG. 7.
Figure 9B:
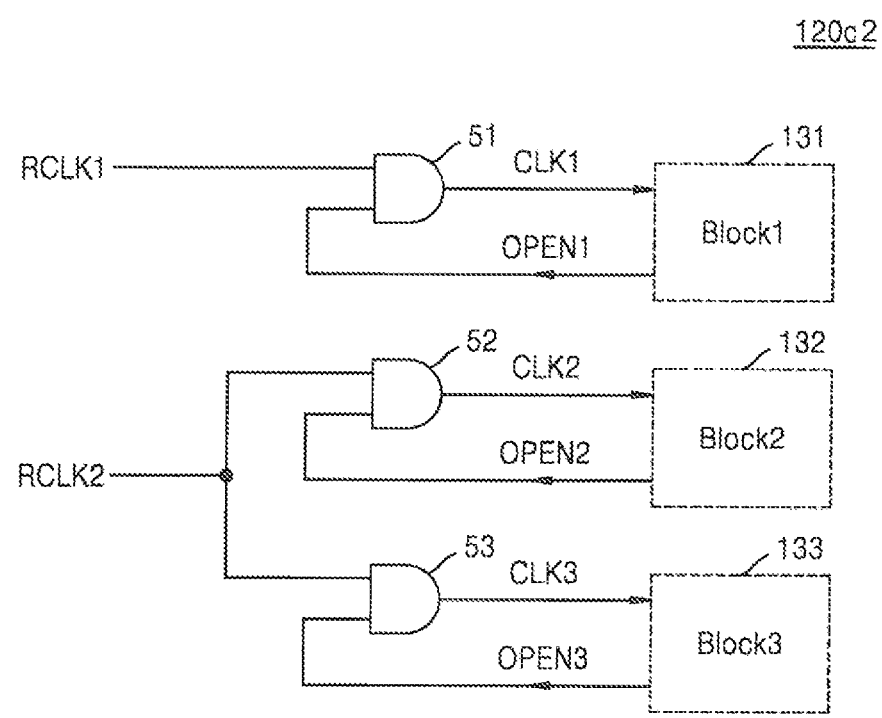

FIGS. 9A and 9B illustrate implementation examples of a clock gating unit of FIG. 7. For convenience of description, a plurality of function blocks 131 to 133 are illustrated. Referring to FIG. 9A, a clock gating unit 120c1 may be implemented with a plurality of logic gates 41 to 43. In an exemplary embodiment, each of the logic gates 41 to 43 may be an AND gate. The clock gating unit 120c1 may receive a reference clock RCLK from the clock generator 110 (see FIG. 7) and first to third operation enable signals OPEN1 to OPEN3 from the plurality of function blocks 131 to 133. The clock gating unit 120c1 may perform a logic combination on the reference clock RCLK and the first to third operation enable signals OPEN1 to OPEN3 by using first to third AND gates 41 to 43 to generate first to third clocks CLK1 to CLK3 and may perform gating on the first to third clocks CLK1 to CLK3.

The first to third AND gates 41 to 43 tray perform gating on the reference clock RCLK based on a received operation enable signal to generate the first to third clocks CLK1 to CLK3, respectively. When the first operation enable signal OPEN1 has a logic high level, the first AND gate 41 may output the first clock CLK1, and when the first operation enable signal OPEN1 has a logic low level, the first AND gate 41 may block the first clock CLK1. When the second operation enable signal OPEN2 has a logic high level, the second AND gate 42 may output the second clock CLK2, and when the second operation enable signal OPEN2 has a logic low level, the second AND gate 42 may block the second clock CLK2. When the third operation enable signal OPEN3 has a logic high level, the third AND gate 43 may output the third clock CLK3, and when the third operation enable signal OPEN3 has a logic low level, the third AND gate 43 may block the third clock CLK3.

Referring to FIG. 9B, a clock gating unit 120c2 may be implemented with a plurality of logic gates 51 to 53. In an exemplary embodiment, each of the logic gates 51 to 53 may be an AND gate. A configuration and an operation of FIG. 9B are similar to those of FIG. 9A. In FIG. 9B, the clock gating unit 120c2 may generate a plurality of clocks CLK1 to CLK3, based on a plurality of reference clocks (for example, a first reference clock RCLK1 and a second reference clock RCLK2). In an exemplary embodiment, frequencies or phases of the first and second reference clocks RCLK1 and RCLK2 may differ.

For example, as shown, a first clock CLK1 may be generated based on the first reference clock RCLK1, and a second clock CLK2 and a third clock CLK3 may be generated based on the second reference clock RCLK2. The first AND gate 51 may receive the first reference clock RCLK1 to generate the first clock CLK1. The first AND gate 51 may perform gating on the first clock CLK1, based on the first operation enable signal OPEN1. The second AND gate 52 may receive the second reference clock RCLK2 to generate the second clock CLK2, and the third AND gate 53 may receive the second reference clock RCLK2 to generate the third clock CLK3. The second AND gate 52 may perform gating on the second clock CLK2, based on the second operation enable signal OPEN2, and the third AND gate 53 may perform gating on the third clock CLK3, based on the third operation enable signal OPEN3. Detailed operations of the first to third AND gates 51 to 53 are substantially the same as those of the first to third AND gates 41 to 43 of FIG. 9A, and thus, repetitive operations are not repeated.

Figure 10:
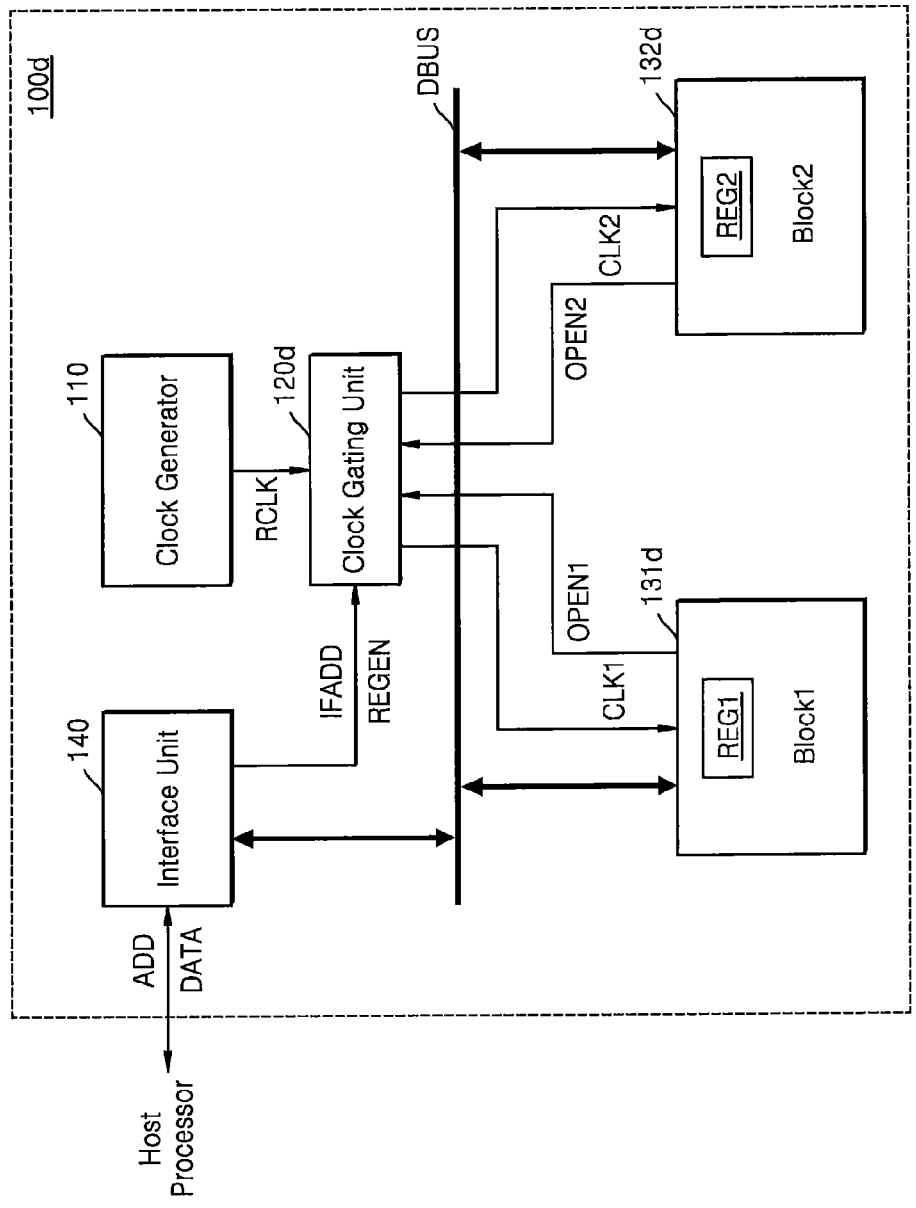
FIG. 10 is a block diagram illustrating an implementation example of a semiconductor device according to an exemplary embodiment.

FIG. 10 is a block diagram illustrating an implementation example of a semiconductor device according to an exemplary embodiment. Referring to FIG. 10, a semiconductor device 100d may include a plurality of function blocks 131d and 132d, a clock generator 110, a clock gating unit 120d, and an interface unit 140. The semiconductor device 100d of FIG. 10 is illustrated as including two function blocks 131d and 132d, but is not limited thereto. In other exemplary embodiments, the semiconductor device 100d may include three or more function blocks. The descriptions of the clock generator 110, the clock gating unit 120, and the function blocks 131 to 133 illustrated in FIGS. 1 and 3 may be applied to the present embodiment. Also, the description of the interface unit 140 of FIG. 4 may be applied to the present embodiment. Thus, repetitive descriptions are not repeated.

As described above with reference to FIG. 4, each of the function blocks 131d and 132d may include one or more registers REG1 and REG2, which may each store received data, based on a clock supplied to a corresponding function block. The plurality of function blocks 131d and 132d may respectively supply operation enable signals OPEN1 and OPEN2 indicating an operating state to the clock gating unit 120d. For example, when the first function block 131d is in an operating state, the first function block 131d may supply a first operation enable signal OPEN1 having a logic high level to the clock gating unit 120d. When the first function block 131d is not in the operating state, for example, when the first function block 131d is in the standby state or the idle state or does not transmit or receive data to or from another function block (or another circuit), the first function block 131d may supply the first operation enable signal OPEN1 having a logic low level to the clock gating unit 120d. Similarly, the second function block 132d may supply a second operation enable signal OPEN2 to the clock gating unit 120d.

The clock gating unit 120d may generate a first clock CLK1 and a second clock CLK2 respectively supplied to the first function block 131d and the second function block 132d, based on a reference clock RCLK. The first clock CLK1 and the second clock CLK2 may be respectively supplied to the first function block 131d and the second function block 132d through different signal transmission paths. Also, the clock gating unit 120d may perform gating on the first clock CLK1 and the second clock CLK2, based on the operation enable signals OPEN1 and OPEN2, a register enable signal REGEN, and address information IFADD.

For example, the clock gating unit 120d may perform gating on the first clock CLK1, based on the register enable signal REGEN and the address information IFADD supplied from the interface unit 140 and the first operation enable signal OPEN1 supplied from the first function block 131d. When the address information IFADD indicates the register REG1 or the first function block 131d, the clock gating unit 120d may output the first clock CLK1 in a period where the register enable signal REGEN is activated. Also, when the first operation enable signal OPEN1 has a logic high level, the clock gating unit 120d may output the first clock CLK1.

Similarly, the clock gating unit 120d may perform gating on the second clock CLK2, based on the register enable signal REGEN and the address information IFADD supplied from the interface unit 140 and the second operation enable signal OPEN2 supplied from the second function block 132d. When the address information IFADD indicates the register REG2 or the second function block 132d, the clock gating unit 120d may output the second clock CLK2 in the period where the register enable signal REGEN is activated. Also, when the second operation enable signal OPEN2 has a logic high level, the clock gating unit 120d may output the second clock CLK2.

Figure 11:
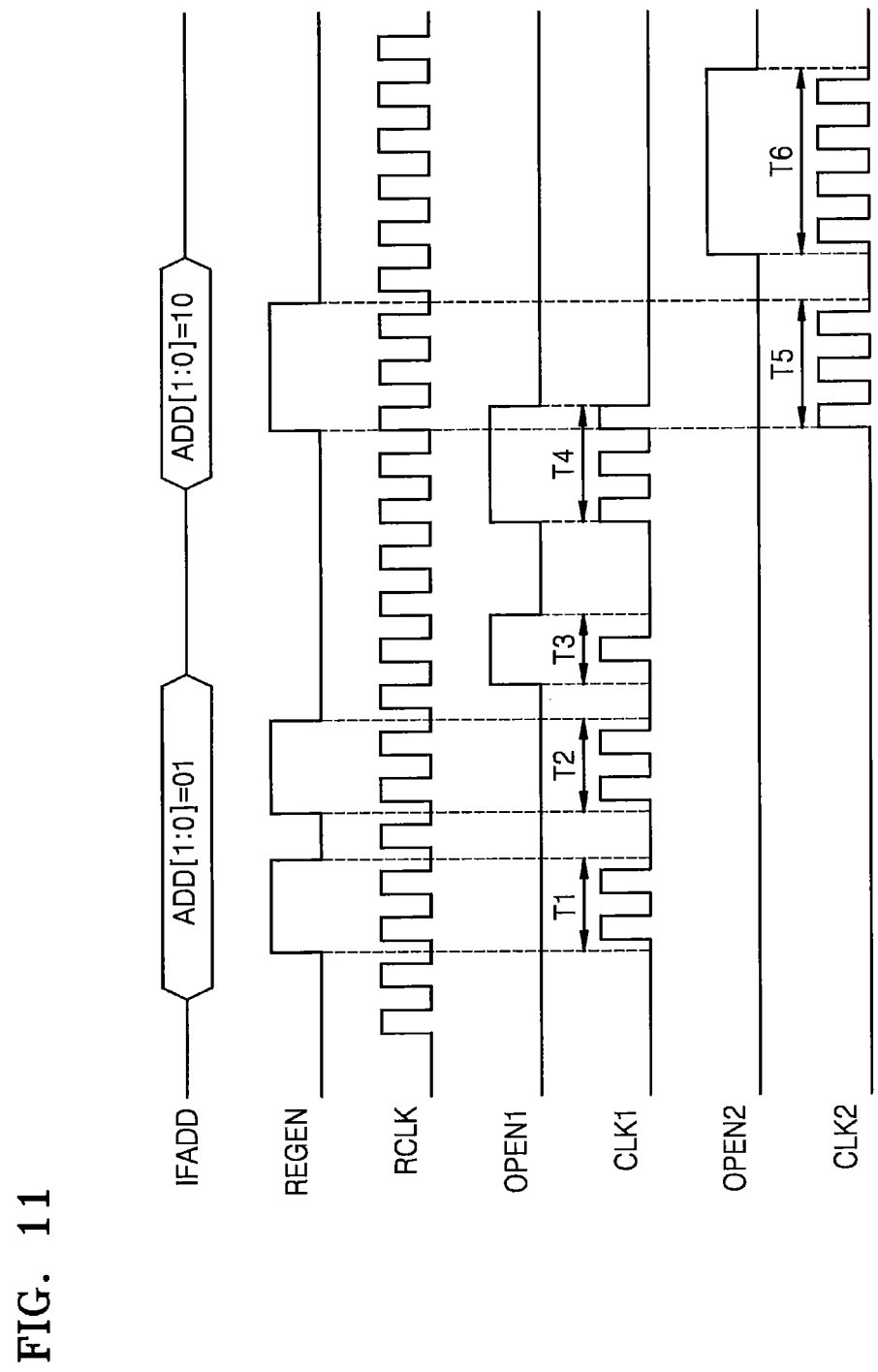
FIG. 11 is a timing diagram of the semiconductor device of FIG. 10.

FIG. 11 is a timing diagram of the semiconductor device of FIG. 10. Referring to FIG. 11, the address information IFADD may include a plurality of bits. For example, the address information IFADD may include 2-bit data ADD[1:0]. If the 2-bit data ADD[1:0] is 01, the 2-bit data ADD[1:0] may indicate the first function block 131d (see FIG. 10). If the 2-bit data ADD[1:0] is 01, the 2-bit data ADD[1:0] may indicate the second function block 132d (see FIG. 10). As shown in FIG. 11, the address information IFADD may indicate the first function block 131d, and the first clock CLK1 may be output in first and second periods T1 and T2 where the register enable signal REGEN is activated. Also, the first clock CLK1 may be output in third and fourth periods T3 and T4 where the first operation enable signal OPEN1 has a logic high level. The address information IFADD may indicate the second function block 132d, and the second clock CLK2 may be output in a fifth period T5 where the register enable signal REGEN is activated. Also, the second clock CLK2 may be output in a sixth period T6 where the second operation enable signal OPEN2 has a logic high level.

In an exemplary embodiment, as shown, a period where the first clock CLK1 is output may overlap a period where the second clock CLK2 is output.

Figure 12:
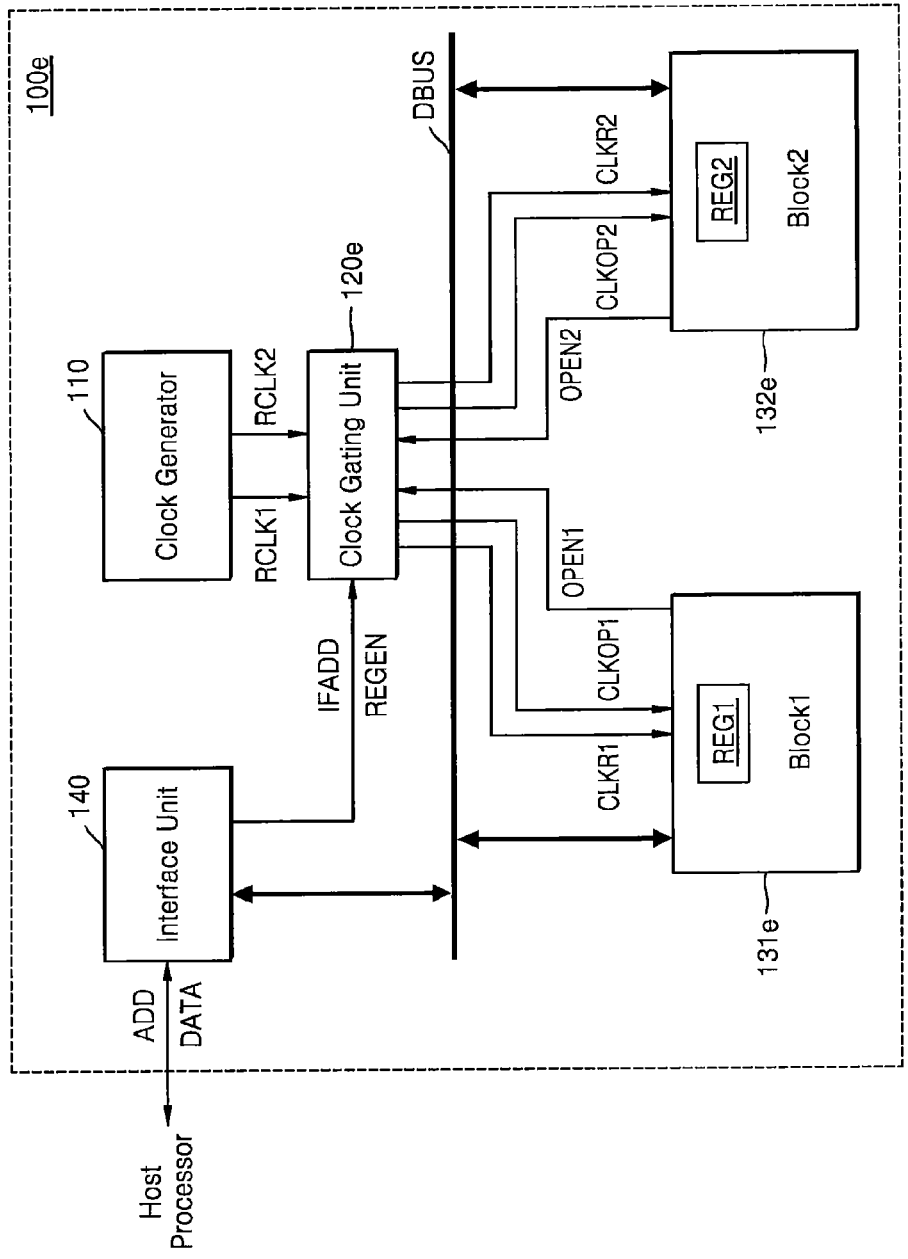
FIG. 12 is a block diagram illustrating an implementation example of a semiconductor device according to an exemplary embodiment.

FIG. 12 is a block diagram illustrating an implementation example of a semiconductor device according to an exemplary embodiment. Referring to FIG. 12, a semiconductor device 100e may include a plurality of function blocks 131e and 132e, a clock generator 110, a clock gating unit 120e, and an interface unit 140. The descriptions of the clock generator 110, the clock gating unit 120, and the function blocks 131 to 133 illustrated in FIGS. 1 and 3 may be applied to the present embodiment. Also, the description of the interface unit 140 of FIG. 4 may be applied to the present embodiment. Thus, repetitive descriptions are not repeated.

Each of the function blocks 131e and 132e may include one or more registers (for example, a first register REG1 and a second register REG2), which may each store received data, based on a clock supplied to a corresponding function block. The plurality of function blocks 131e and 132e may respectively supply operation enable signals OPEN1 and OPEN2 indicating an operating state to the clock gating unit 120e.

The clock gating unit 120e may receive a plurality of reference clocks (for example, a first reference clock RCLK1 and a second reference clock RCLK2) from the clock generator 110 and may generate a plurality of clocks CLKR1, CLKOP1, CLKR2 and CLKOP2 supplied to a first function block 131e and a second function block 132e, based on the received reference clocks. In an exemplary embodiment, frequencies or phases of the first and second reference clocks RCLK1 and RCLK2 may differ.

The plurality of clocks CLKR1, CLKOP1, CLKR2 and CLKOP2 may include a first register clock CLKR1 and a first operation clock CLKOP1 supplied to the first function block 131e and a second register clock CLKR2 and a second operation clock CLKOP2 supplied to the second function block 132e.

The clock gating unit 120e may generate the first register clock CLKR1 and the second register clock CLKR2, based on the first reference clock RCLK1 and may perform gating on the first register clock CLKR1 and the second register clock CLKR2, based on first address information IFADD and register enable signal REGEN. Also, the clock gating unit 120e may generate the first operation clock CLKOP1 and the second operation clock CLKOP2, based on the second reference clock RCLK2 and may perform gating on the first operation clock CLKOP1 and the second operation clock CLKOP2, based on the operation enable signals OPEN1 and OPEN2.

The first register REG1 of the first function block 131e may receive and store data, based on the first register clock CLKR1. The first function block 131e may operate based on the first operation clock CLKOP1. The second register REG2 of the second function block 132e may receive and store data, based on the second register clock CLKR2. The second function block 132e may operate based on the second operation clock CLKOP2. According to the above-described gating operation of the clock gating unit 120e, the clock gating unit 120e may selectively supply the first register clock CLKR1 to the first function block 131e in a period where the interface unit 140 transmits data DATA, received from the outside, to the first register REG1 and may selectively supply the second register clock CLKR2 to the second function block 132e in a period where the interface unit 140 transmits the data DATA, received from the outside, to the second register REG2. Also, the clock gating unit 120e may selectively supply the first operation clock CLKOP1 to the first function block 131e in a period where the first function block 131e is in an operating state and may selectively supply the second operation clock CLKOP2 to the second function block 132e in a period where the second function block 131e is in the operating state. Therefore, the clock gating unit 120e may block clocks supplied to the first and second function blocks 131e and 132e in a period where each of the first and second function blocks 131e and 132e does not perform any operation.

Figure 13:
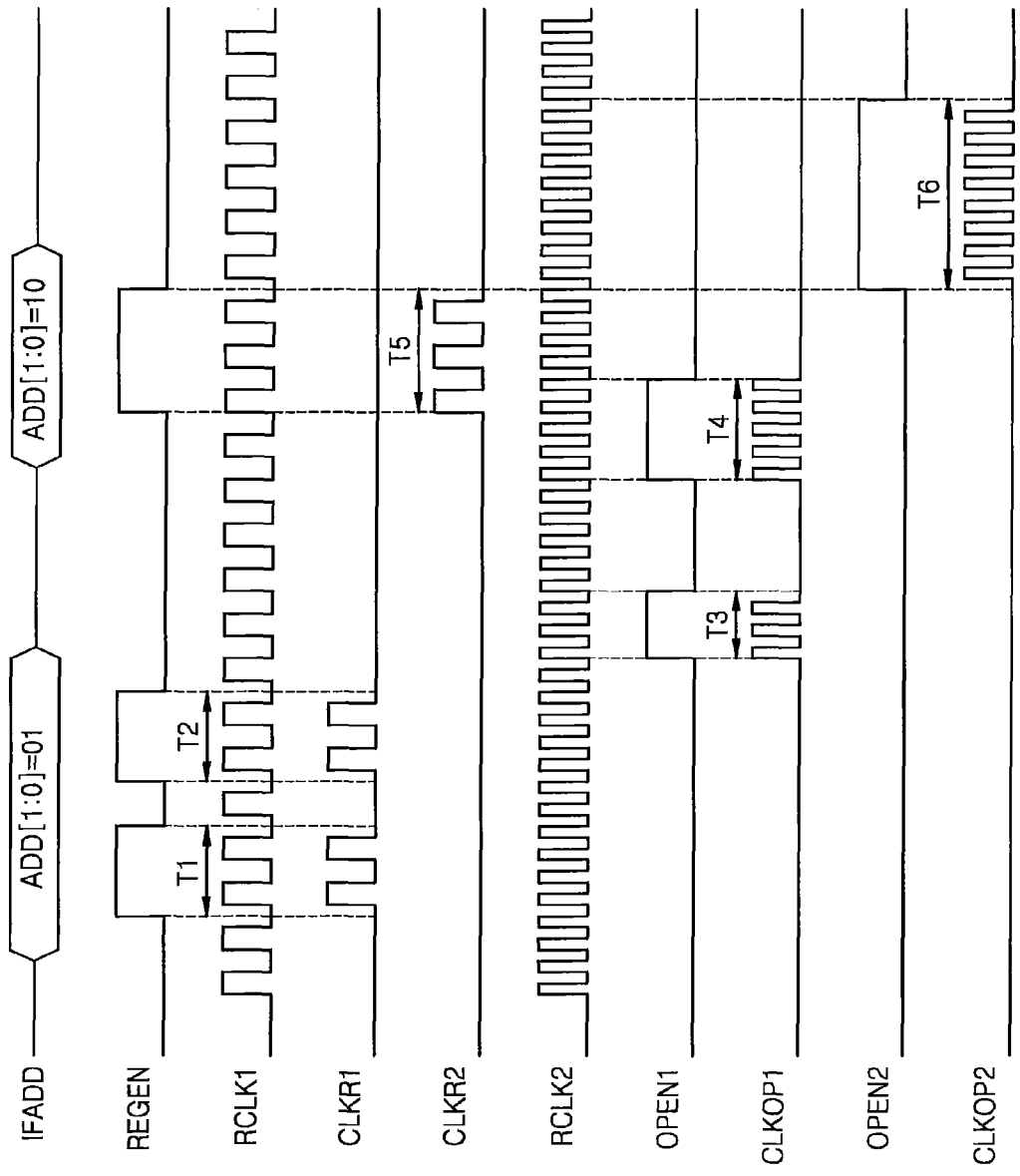
FIG. 13 is a timing diagram of the semiconductor device of FIG. 12.

FIG. 13 is a timing diagram of the semiconductor device of FIG. 12. Referring to FIG. 13, the first register clock CLKR1 and the second register clock CLKR2 may be generated based on the first reference clock RCLK1, and the first operation clock CLKOP1 and the second operation clock CLKOP2 may be generated based on the second reference clock RCLK2. Frequencies of the first and second reference clocks RCLK1 and RCLK2 may differ. In FIG. 13, a frequency of the second reference clock RCLK2 is shown as higher than that of the first reference clock RCLK1, but the present embodiment is not limited thereto. A frequency of the second reference clock RCLK2 may be equal to or lower than that of the first reference clock RCLK1.

The first register clock CLKR1 generated based on the first reference clock RCLK1 may be output in first and second periods T1 and T2, where the address information IFADD indicates the first function block 131e, among periods where the register enable signal REGEN is activated. At this time, the second register clock CLKR2 may be blocked. The second register clock CLKR2 generated based on the first reference clock RCLK1 may be output in a fifth period T5, where the address information IFADD indicates the second function block 132e, among the periods where the register enable signal REGEN is activated. At this time, the first register clock CLKR1 may be blocked. In an exemplary embodiment, a period where the first register clock CLKR1 is output may not overlap a period where the second register clock CLKR2 is output.

The first operation clock CLKOP1 may be output in third and fourth periods T3 and T4 where the first operation enable signal OPEN1 has a logic high level, and the second operation clock CLKOP2 may be output in a sixth period T6 where the second operation enable signal OPEN2 has a logic high level. In an exemplary embodiment, a period where the first operation clock CLKOP1 is output may overlap a period where the second operation clock CLKOP2 is output. Also, in an exemplary embodiment, a period where the first register clock CLKR1 is output may overlap a period where the first operation clock CLKOP1 is output, and a period where the second register clock CLKR2 is output may overlap a period where the second operation clock CLKOP2 is output.

Figure 14:
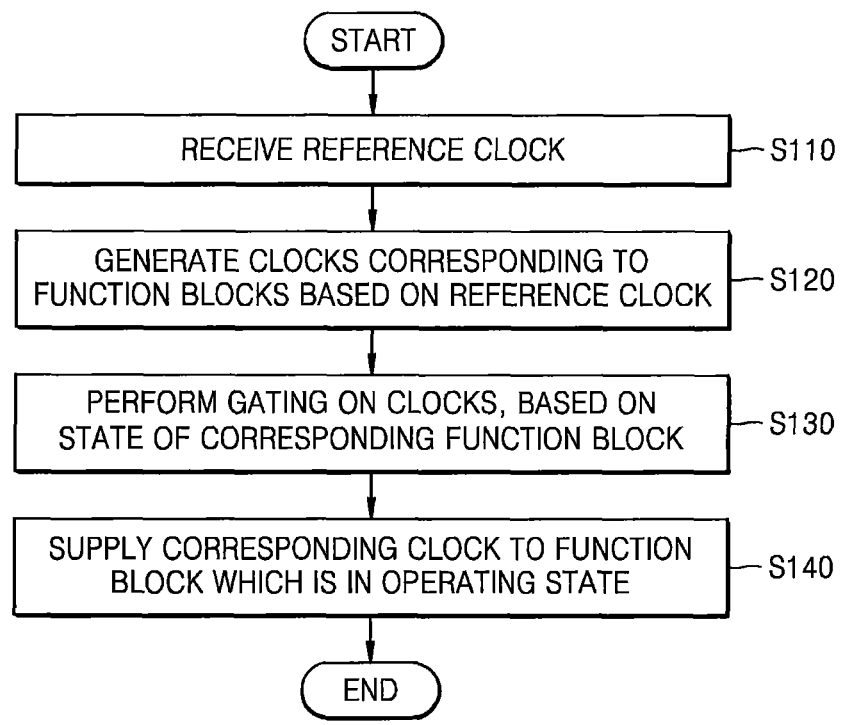
FIG. 14 is a flowchart illustrating methods of operating a semiconductor device according to an exemplary embodiment.

FIG. 14 is a flowchart illustrating an operation method of a semiconductor device according to an exemplary embodiment. In detail, the operation method of FIG. 14 corresponds to a clock gating method performed by the clock gating units 120, 120b, 120c, 120d and 120e. Referring to FIG. 14, in operation S110, a clock gating unit may receive a reference clock. In an exemplary embodiment, the clock gating unit may receive a plurality of reference clocks. Frequencies or phases of the reference clocks may differ or may be the same.

In operation S120, the clock gating unit may generate a plurality of clocks respectively corresponding to a plurality of function blocks. In operation S130, the clock gating unit may perform gating, based on states of the function blocks respectively corresponding to the plurality of clocks. In an exemplary embodiment, operations S120 and S130 may be simultaneously performed. The clock gating unit may divide the reference clock so as to correspond to the plurality of function blocks and then may perform gating on the divided reference clock in correspondence with each of the function blocks, thereby generating the plurality of clocking and performing gating on the plurality of clocks. A clock corresponding to a function block having an operating state may be output according to the gating operation which is performed in operation S130. For example, when a register included in a function block receives data, performs a certain operation, or transmits or receives data to or from other circuits (for example, other function blocks), a clock corresponding to the function block may be output. When a function block does not perform any operation, a clock corresponding to the function block may be blocked.

In operation S140, the clock gating unit may supply a corresponding clock to a function block having an operating state. In an exemplary embodiment, the clock gating unit may supply a plurality of clocks to one function block. In an exemplary embodiment, a function block may perform a plurality of functions, and each of the functions may be performed based on different clocks. For example, when a register included in a function block receives and stores data, the register may operate based on a register clock, and when the function block performs a normal operation, the function block may operate based on an operation clock. The clock gating unit may supply a register clock to a function block in a period where a register of the function block performs an operation of receiving and storing data, and in a period where the function block performs a normal operation, the clock gating unit may supply an operation clock to the function block. However, a period where a register clock is supplied and a period where an operation clock is supplied may not be an exclusive period, and the periods may overlap each other.

Figure 15:
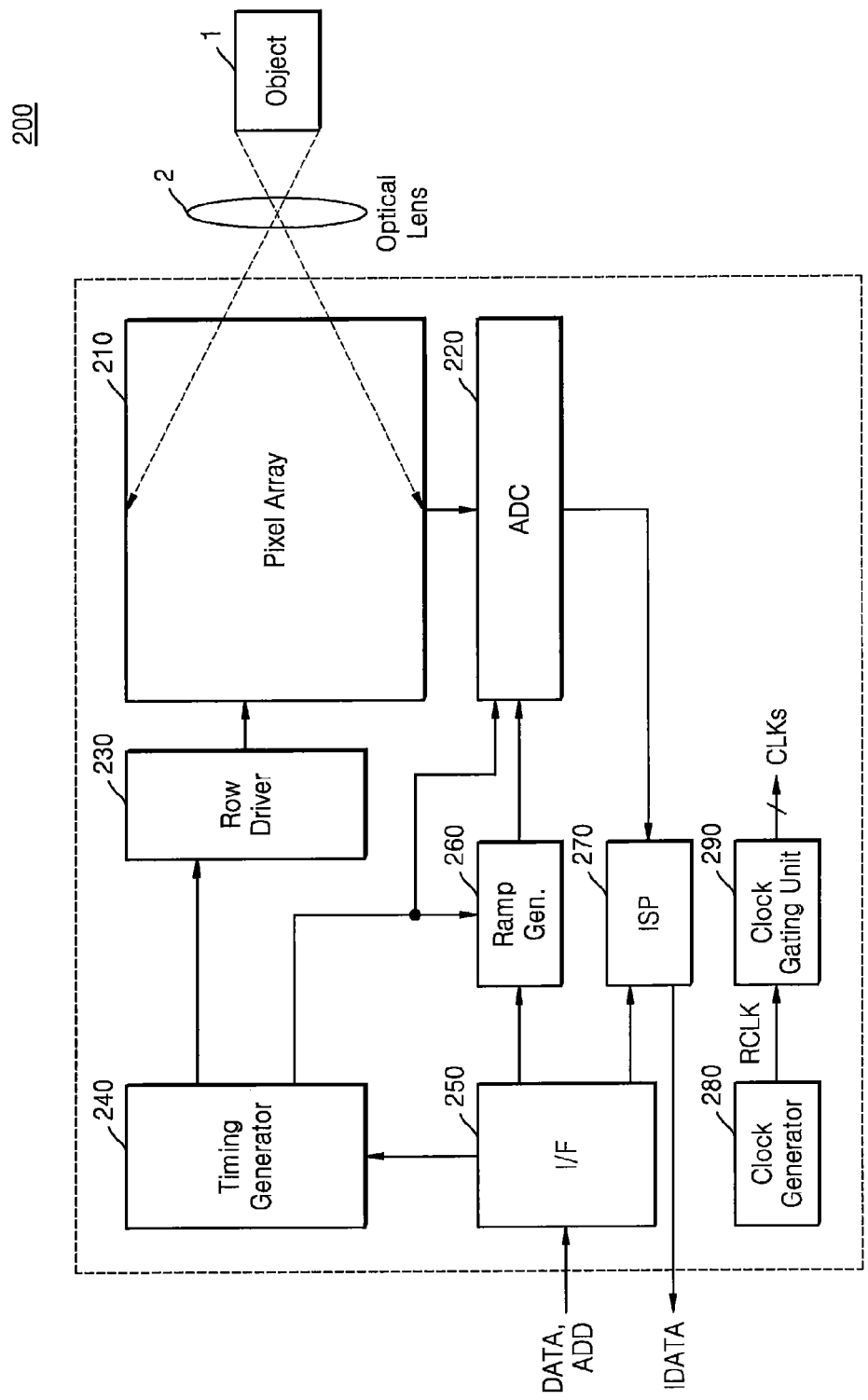
FIG. 15 is a block diagram illustrating an image sensor according to an exemplary embodiment.

FIG. 15 is a block diagram illustrating an image sensor 200 according to an exemplary embodiment. The semiconductor devices 100, 100a, 100b, 100c, 100d and 100e according to exemplary embodiments described above with reference to FIGS. 1 to 14 may each be implemented as an image sensor. The image sensor 200 may generate image data IDATA of an object 1 photographed or captured by an optical lens 2. For example, the image sensor 200 may be implemented as a complementary metal-oxide semiconductor (CMOS) image sensor. Referring to FIG. 15, the image sensor 200 may include a pixel array 210, an analog-digital converter (ADC) 220, a row driver 230, a timing generator 240, an interface (I/F) 250, a ramp signal generator 260, an image signal processor 270, a clock generator 280, and a clock gating unit 290.

The pixel array 210 may include a plurality of pixels which are arranged in a matrix form. The row driver 230 may drive, to the pixel array 210, a plurality of control signals for controlling an operation of each of the pixels according to control by the timing generator 240. The timing generator 240 may control operations of the row driver 230, the ADC 220, the ramp signal generator 260, and the image signal processor 270. The ADC 220 may process a pixel electrical signal, output from each of a plurality of column lines provided in the pixel array 210, to output a digital signal. For example, the ADC 220 may perform correlation dual sampling on the pixel electrical signals and may compare each of the correlation-dual-sampled pixel electrical signals with the ramp signal output from the ramp signal generator 260. The ADC 220 may convert a comparison signal into raw data which is a digital signal.

The image signal processor 270 may perform image processing, such as color correlation, on the raw data output from the ADC 220 to generate the image data IDATA. The image data IDATA may be output to an external device. The interface 250 may receive, from the external device, data DATA and an address signal ADD indicating a register storing the data DATA and may store the data DATA in the register indicated by the address signal ADD. The ADC 220, the row driver 230, the timing generator 240, the ramp signal generator 260, and the image signal processor 270 (hereinafter referred to as function blocks) may each include at least one register. Operation modes or operation options of the function blocks may be set based on the data DATA stored in the register. Although not shown, the image sensor 200 may include a data bus, and the interface 50 may transmit the data DATA to one of the function blocks of the image sensor 200 through the data bus.

The function blocks of the image sensor 200 may operate based on a received clock. The function blocks may store the data DATA in the register or may perform certain functions, based on the received clock. The clock generator 280 may generate a reference clock RCLK, and the clock gating unit 290 may generate a plurality of clocks CLK supplied to the function blocks, based on the reference clock RCLK. The clock gating unit 290 may supply a corresponding clock to the function blocks through different transmission paths.

The clock gating unit 290 may perform gating on the corresponding clock, based on states of the function blocks. A clock may be output to a function block having an operating state among the function blocks according to the gating operation of the clock gating unit 290 and may be blocked from being output to a function block which is not in the operating state. For example, when the interface 250 transmits the data DATA to the timing generator 240, the clock gating unit 290 may output a clock supplied to the timing generator 240 and may block a clock corresponding to other function blocks. For example, the clock gating unit 290 may output a register clock, supplied to a register included in the timing generator 240, to the timing generator 240. As another example, when an operation of the ADC 220 is completed and the image signal processor 290 processes raw data received from the ADC 220, the clock gating unit 290 may block a corresponding clock from being transmitted to the ADC 220 and may transmit the corresponding clock to the image signal processor 270.

As described above, the image sensor 200 according to an exemplary embodiment may separately supply clocks to the plurality of function blocks and may perform gating on each of the clocks according to a state of a corresponding function block, thereby shortening a time for which the clocks are respectively transmitted to the function blocks. Therefore, switching power caused by toggling of a clock is reduced, and thus, consumption power of the image sensor 200 is reduced.

Figure 16:
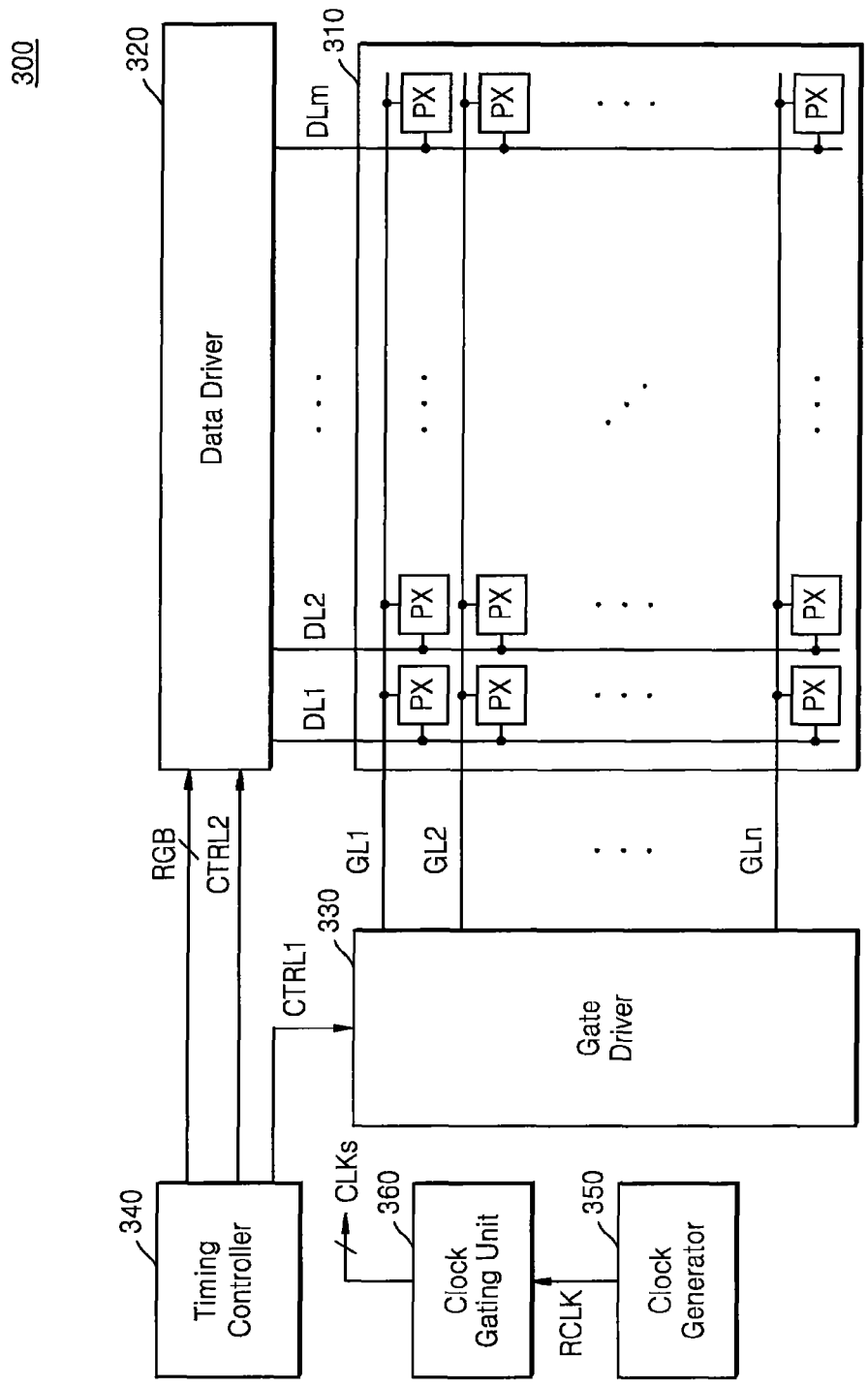
FIG. 16 is a block diagram illustrating a display device according to an exemplary embodiment.

FIG. 16 is a block diagram illustrating a display device 300 according to an exemplary embodiment. The semiconductor devices 100, 100a, 100b, 100c, 100d and 100e according to exemplary embodiments described above with reference to FIGS. 1 to 14 may each be implemented as a display device. Referring to FIG. 16, the display device 300 may include a display panel 310, a data driver 320, a gate driver 330, a timing controller 340, a clock generator 350, and a clock gating unit 360.

The display panel 310 may include a plurality of gate lines GL1 to GLn, a plurality of data lines DL1 to DLm, and a plurality of pixels PX which are respectively provided in a plurality of areas defined by intersections of the gate lines GL1 to GLn and the data lines DL1 to DLm. The display panel 310 may include a plurality of horizontal lines, and each of the horizontal lines may include a plurality of pixels connected to one gate line. The display panel 310 may be driven in units of one horizontal line.

The timing controller 340 may control an overall operation of the display device 300. The timing controller 340 may generate control signals CTRL1 and CTRL2 for controlling the data driver 320 and the gate driver 330 and may respectively supply the control signals CTRL1 and CTRL2 to the gate driver 330 and the data driver 320. The timing controller 340 may receive video data from the outside, for example, a host controller of an electronic device equipped with the display device 300, may convert the video data to generate image data RGB, and supply the image data RGB to the data driver 320. For example, the timing controller 340 may convert the video data in order for the video data to match a structure of the display panel 310, or may perform color correction on the video data to convert the video data.

The gate driver 330 may sequentially supply a gate-on signal to the gate lines GL1 to GLn in response to a gate control signal CTRL1 supplied from the timing controller 340.

In response to a data control signal CTRL2, the data driver 320 may convert the image data RGB into image signals (for example, grayscale voltages) that are analog signals, and may respectively output the image signals to the data lines DL1 to DLm. The image signals may be respectively supplied to pixels connected to a gate line to which the gate-on signal is applied.

The clock generator 350 may generate a reference clock RCLK, and the clock gating unit 360 may generate a plurality of clocks respectively supplied to the data driver 320, the timing controller 340, and the gate driver 330 (hereinafter referred to as function blocks), based on the reference clock RCLK. The clock gating unit 360 may transmit the clocks to the function blocks through different transmission paths. Also, the clock gating unit 360 may perform gating on a clock corresponding to each of the function blocks, based on states of the function blocks. A clock may be output to a function block having an operating state among the function blocks according to the gating operation of the clock gating unit 360 and may be blocked from being output to a function block which is not in the operating state.

As described above, the display device 300 according to an exemplary embodiment may separately supply clocks to the plurality of function blocks and may perform gating on each of the clocks according to a state of a corresponding function block, thereby shortening a time for which the clocks are respectively transmitted to the function blocks. Therefore, switching power caused by toggling of a clock is reduced, and thus, consumption power of the display device 300 is reduced.

Hereinabove, an implementation example of the semiconductor device according to the present embodiment has been described with reference to FIGS. 15 and 16. However, this is merely an example, and the inventive concept is not limited thereto. In addition, the semiconductor device according to exemplary embodiments may be applied to memory devices and various semiconductor devices or semiconductor chips such as system-on chips (SoCs), etc.

Figure 17:
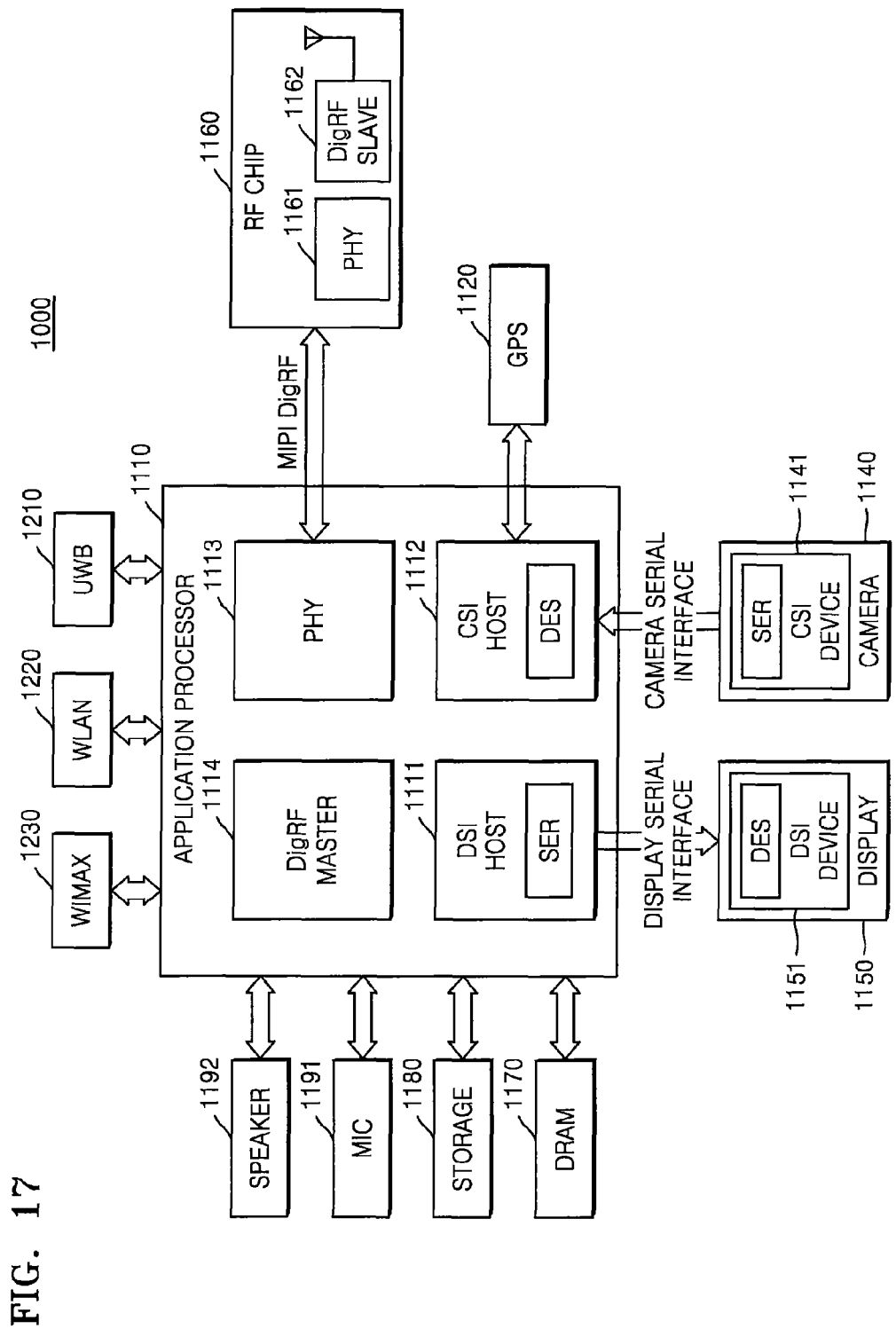
FIG. 17 is a block diagram illustrating a computing system according to an exemplary embodiment.

FIG. 17 is a block diagram illustrating a computing system 1000 according to an exemplary embodiment. Referring to FIG. 17, the computing system 1000 may be implemented with a data processing device capable of using or supporting a mobile industry processor interface (MIPI), and may include an application processor 1110, a photographing device 1140, and a display 1150. A camera serial interface (CSI) host 1112 of the application processor 1110 may perform serial communication with the CSI device 1141 of the photographing device 1140 through the CSI. In an exemplary embodiment, the CSI host 1112 may include a deserializer DES, and the CSI device 1141 may include a serializer SER. In another exemplary embodiment, the CSI host 1112 may include a serializer SER, and the CSI device 1141 may include a deserializer DES.

A DSI host 1111 of the application processor 1110 may perform serial communication with a display serial interface (DSI) device 1151 of the display 1150 through a DSI. In an exemplary embodiment, the DSI host 1111 may include a serializer SER, and the DSI device 1151 may include a deserializer DES. The computing system 1000 may further include a radio frequency (RF) chip 1160 for performing communication with the application processor 1110. A physical (PHY) 1113 of the computing system 1000 and a physical (PHY) 1161 of the RF chip 1160 may transmit or receive data therebetween according to MIPI DigRF. Also, the application processor 1110 may further include a DigRF master 1114 that controls transmission or reception of data based on the MIPI DigRF.

The computing system 1000 may include a global positioning system (GPS) 1120, a storage 1180, a dynamic random access memory (DRAM) 1170, a microphone 1191, and a speaker 1192. Also, the computing system 1000 may perform communication by using an ultra-wide band (UWB) 1210, a wireless local area network (WLAN) 1220, and a worldwide interoperability for microwave access (WIMAX) 1230. However, a structure and an interface of the computing system 1000 are merely an example, and are not limited thereto.

The semiconductor devices 100, 100a, 100b, 100c, 100d and 100e according to exemplary embodiments described above with reference to FIGS. 1 to 14 may each be implemented as at least one of the DSI device 1151, the RF chip 1160, the storage 1180, and the DRAM 1170. Therefore, switching power caused by toggling of a clock is reduced, and thus, consumption power of the computing system 1000 is reduced.

The computing system 1000 of FIG. 17 may be applied to smartphones, tablet personal computers (PCs), desktop PCs, personal digital assistants (PDAs), mobile devices, cameras, wearable devices, and/or the like. Also, the computing system 1000 may be applied to smart appliances, furniture including an image display function or a communication function, various medical devices, electronic devices for vehicles, and/or the like.

Accordingly, as described hereinabove with respect to FIGS. 7-13, integrated circuit devices 100c-100e according to embodiments of the invention include clock gating circuits 120c-120e. In some of these embodiments of the invention, a clock gating circuit is configured to generate a first plurality of clocks (e.g., CLK1-CLK3) in response to a first reference clock (RCLK) having a first frequency and a plurality of operation enable signals (e.g., OPEN1-OPEN3). A plurality of functional circuits 131-133 are provided, which are responsive to respective ones of the first plurality of clocks. This plurality of functional circuits 131-133 is configured to generate respective ones of the plurality of operation enable signals. As illustrated by the timing diagrams of FIGS. 8, 11 and 13, each of the plurality of operation enable signals has a first logic state (e.g., logic 1) that enables a respective clock within the clock gating circuit and a second logic state (e.g., logic 0) that disables the respective clock within the clock gating circuit.

As shown by FIG. 10, the clock gating circuit 120d is responsive to a register enable signal (REGEN) and an address (IFADD) designating one of the plurality of functional circuits (e.g., 131d, 132d). The register enable signal has active and inactive logic states. An overlapping combination of an active register enable signal (REGEN) and an address designating a first of the plurality of functional circuits causes the clock gating circuit 120d to provide the first of the plurality of functional circuits with a respective clock (e.g. CLK1, CLK2) As shown by the timing diagram of FIG. 11, an overlapping combination of an active register enable signal (REGEN) and an address (IFADD[1:0]) designating a first of the plurality of functional circuits causes the clock gating circuit 120d to provide the first of the plurality of functional circuits with the respective clock, even when the corresponding operation enable signal (OPEN) generated by the first of the plurality of functional circuits is in the second "disabled" logic state.

In addition, as illustrated by FIGS. 12-13, a clock gating circuit 120e is configured to generate a second plurality of clocks in response to a second reference clock (e.g., RCLK2) having a second frequency. As shown by the timing diagram of FIG. 13, an overlapping combination of an active register enable signal and an address designating a first of said plurality of functional circuits (131e, 132e) causes the clock gating circuit 120e to provide the first of the plurality of functional circuits with a respective clock at the second frequency.

While the inventive concept has been particularly shown and described with reference to exemplary embodiments thereof, it will be understood that various changes in form and details may be made therein without departing from the spirit and scope of the following claims.

What is claimed is:

1. An integrated circuit device, comprising:
a clock gating circuit configured to generate a first plurality of clocks in response to a first reference clock at a first frequency and a plurality of operation enable signals; and
a plurality of functional circuits responsive to respective ones of the first plurality of clocks, said plurality of functional circuits configured to generate respective ones of the plurality of operation enable signals, with each of the plurality of operation enable signals having a first logic state that enables a respective clock within said clock gating circuit and a second logic state that disables the respective clock within said clock gating circuit;
wherein said clock gating circuit is further responsive to a register enable signal and an address designating one of said plurality of functional circuits;
wherein the register enable signal has active and inactive logic states; and
wherein an overlapping combination of an active register enable signal and an address designating a first of said plurality of functional circuits causes said clock gating circuit to provide the first of said plurality of functional circuits with a respective clock.

2. The device of claim 1, wherein the overlapping combination of an active register enable signal and an address designating a first of said plurality of functional circuits causes said clock gating circuit to provide the first of said plurality of functional circuits with the respective clock, even when the operation enable signal generated by the first of said plurality of functional circuits is in the second logic state.

3. The device of claim 2, wherein an overlapping combination of an active register enable signal and an address designating a second of said plurality of functional circuits causes said clock gating circuit to provide the second of said plurality of functional circuits with a respective clock.

4. The device of claim 3, wherein the overlapping combination of an active register enable signal and an address designating a second of said plurality of functional circuits causes said clock gating circuit to provide the second of said plurality of functional circuits with the respective clock, even when the operation enable signal generated by the second of said plurality of functional circuits is in the second logic state.

5. The device of claim 1, wherein said clock gating circuit is configured to generate a second plurality of clocks in response to a second reference clock at a second frequency.

6. A semiconductor device comprising:
a plurality of function blocks configured to perform different functions;
a clock generator configured to generate a reference clock; and
a clock gating unit configured to generate a plurality of clocks respectively corresponding to the plurality of function blocks, based on the reference clock, respectively supply the plurality of clocks, to the plurality of function blocks, and perform gating on the plurality of clocks, based on, a state of an enable signal and an address received by said clock gating unit, said enable signal having active and inactive states and said address designating a corresponding one of the plurality of function blocks.

7. The semiconductor device of claim 6, wherein the clock gating unit supplies the plurality of clocks to the plurality of function blocks through point-to-point connections.

8. The semiconductor device of claim 6, wherein the clock gating unit directly receives the reference clock from the clock generator, divides the received reference clock into the plurality of clocks respectively corresponding to the plurality of function blocks, and performs gating on the plurality of clocks.

9. The semiconductor device of claim 6, wherein a physical distance by which the reference clock is transmitted between the clock generator and the clock gating unit is shorter than a physical distance by which the plurality of clocks are transmitted between the clock gating unit and the plurality of function blocks.

10. The semiconductor device of claim 6, wherein
the plurality of function blocks each comprise at least one register configured to store data supplied from an external device, and
the clock gating unit generates the plurality of clocks supplied to the at least one register of each of the function blocks.

11. The semiconductor device of claim 10, further comprising an interface unit configured to receive the address and the data from the external device and supply the data to a first register corresponding to the address among the at least register included in each of the function blocks.

12. The semiconductor device of claim 11, wherein the interface unit supplies the address to the clock gating unit.

13. An image sensor comprising the semiconductor device of claim 6.

14. A semiconductor device comprising:
a first function block including at least one first register that operates, based on a first clock;
a second function block including at east one second register that operates based on a second clock;
an interface unit configured to receive data and an address from an external device and transmit the data to one of the first and second registers that corresponds to the address; and
a clock gating unit configured to perform gating on a reference clock to generate the first clock and the second clock, supply the first clock to the first function block through a first line, and supply the second clock to the second function block through a second line, said clock gating unit responsive to address information generated by said interface unit.

15. The semiconductor device of claim 14, wherein said clock gating unit is further responsive to a register enable signal generated by said interface unit.

16. The semiconductor device of claim 14, further comprising: a data bus configured to transmit the data,
wherein when the data bus transmits the data to the first function block, the clock gating unit outputs the first clock, and
when the data bus transmits the data to the second function block, the clock gating unit outputs the second clock.

* * * * *